(12) United States Patent
Jung

(10) Patent No.: US 7,943,053 B2
(45) Date of Patent: May 17, 2011

(54) METHOD OF FORMING A MICRO PATTERN IN SEMICONDUCTOR DEVICE

(75) Inventor: Woo-Yung Jung, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 763 days.

(21) Appl. No.: 12/019,916

(22) Filed: Jan. 25, 2008

(65) Prior Publication Data

US 2008/0268649 A1 Oct. 30, 2008

(30) Foreign Application Priority Data

Apr. 25, 2007 (KR) .................. 10-2007-0040414

(51) Int. Cl.
*C03C 15/00* (2006.01)
*C03C 25/68* (2006.01)
*C23F 1/00* (2006.01)

(52) U.S. Cl. .......................... 216/41; 438/717

(58) Field of Classification Search .................. 216/41, 216/13; 438/717
See application file for complete search history.

(56) References Cited

U.S. PATENT DOCUMENTS

| 2004/0048469 A1* | 3/2004 | Wu et al. ................. 438/689 |
| 2008/0090418 A1* | 4/2008 | Jeon et al. .............. 438/689 |
| 2008/0090419 A1* | 4/2008 | Koh et al. .............. 438/696 |
| 2009/0004575 A1* | 1/2009 | Kim ........................ 430/5 |

FOREIGN PATENT DOCUMENTS

| KR | 1020060110706 A | 10/2006 |
| KR | 10-0822621 B1 | 4/2008 |
| KR | 10-0822622 B1 | 4/2008 |

* cited by examiner

*Primary Examiner* — Roberts Culbert
(74) *Attorney, Agent, or Firm* — Kilpatrick Townsend & Stockton LLP

(57) ABSTRACT

A method of forming a micro pattern in a semiconductor device includes forming an etching object layer and a hard mask layer on a semiconductor substrate. Cross-shaped first auxiliary patterns are formed on the hard mask layer. An insulating layer is formed on the hard mask layer including the first auxiliary pattern. A second auxiliary pattern is formed on the insulating layer between the first auxiliary patterns. An etching process is performed such that the insulating layer remains only on a lower portion of the second auxiliary pattern. The hard mask is etched through an etching process using the first and second auxiliary patterns as an etching mask to form a hard mask pattern. The etching object layer is etched using the hard mask pattern as an etching mask.

53 Claims, 24 Drawing Sheets

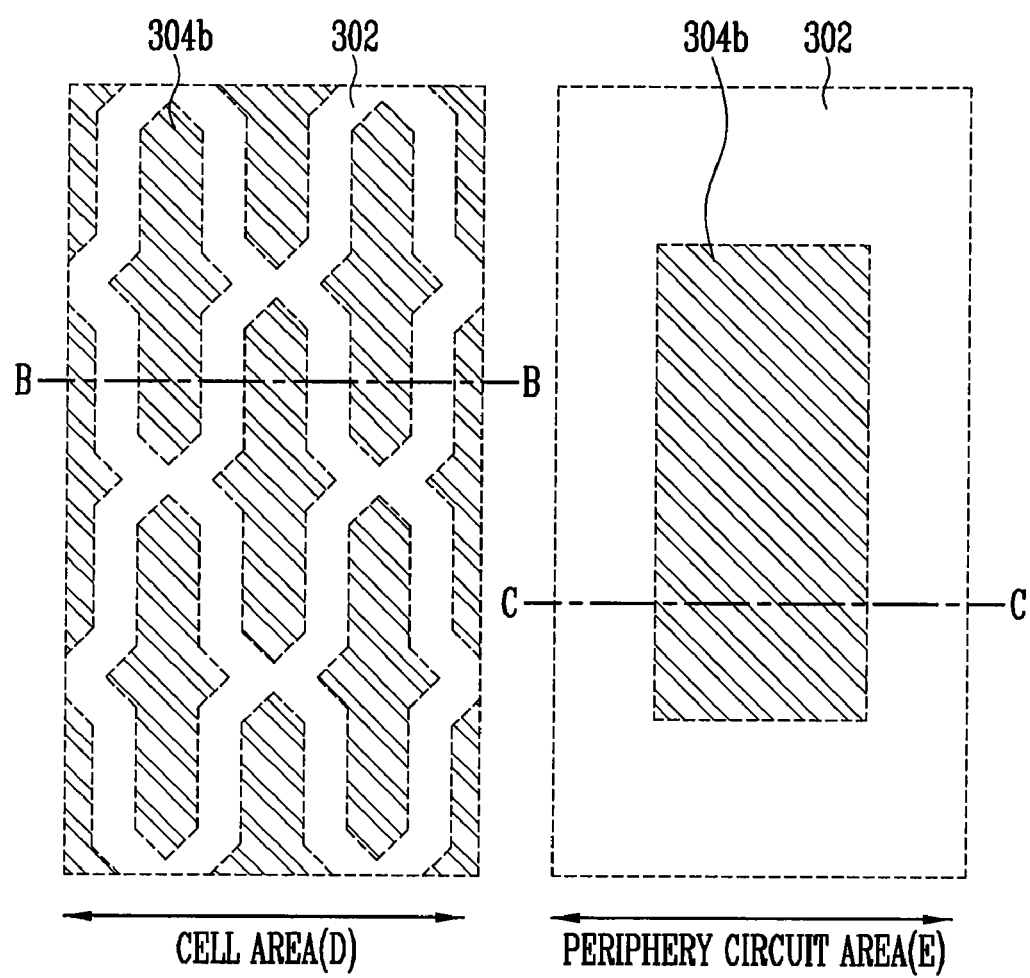

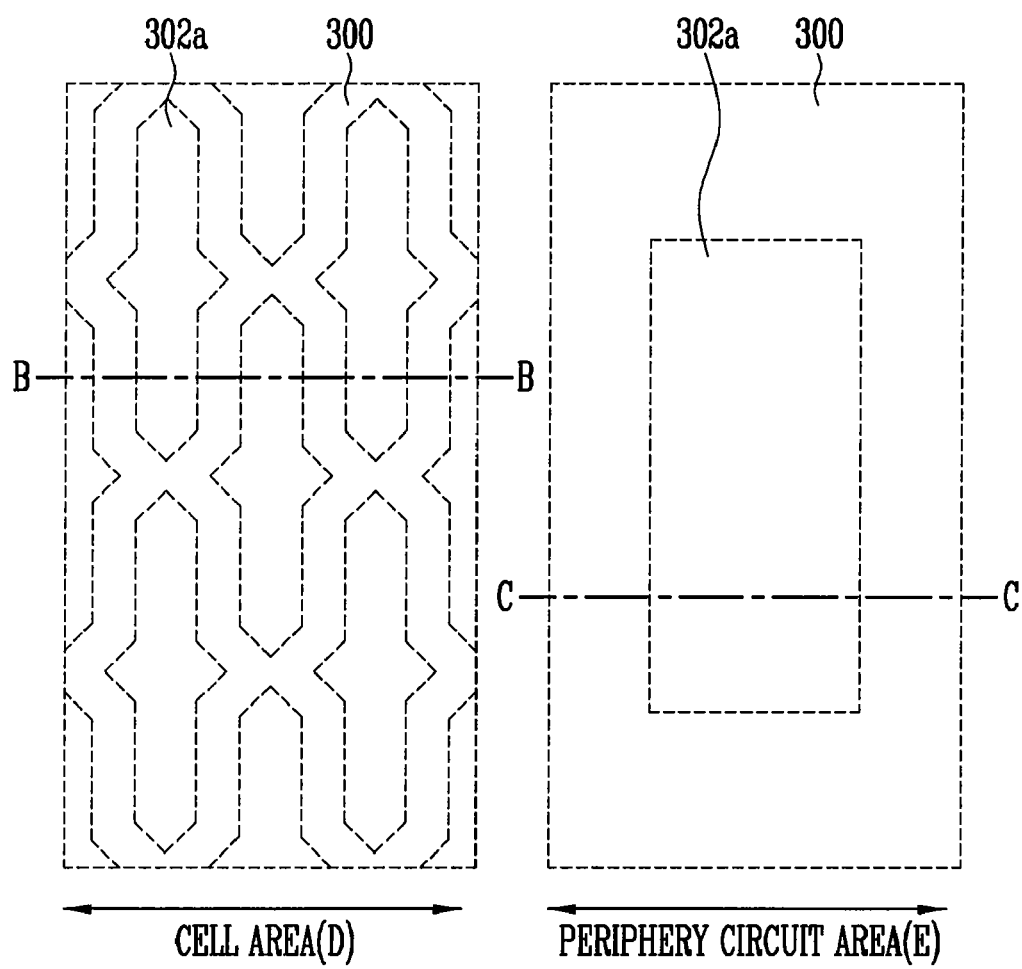

METHOD OF FORMING A MICRO PATTERN IN SEMICONDUCTOR DEVICE

CROSS-REFERENCE TO RELATED APPLICATIONS

This application claims priority from Korean Patent Application No. 2007-0040414, filed on Apr. 25, 2007, the contents of which are incorporated herein by reference in its entirety.

BACKGROUND OF THE INVENTION

The present invention relates to a method of forming a micro pattern in a semiconductor device, and more particularly relates to a method of forming a micro pattern in a semiconductor device which forms a micro pattern that is applicable to a process for forming an isolation layer.

As semiconductor devices become more highly-integrated, a dimension of the minimum line width to be embodied becomes reduced. To realize the micro line width required due to the high integration of the device, various processes have been employed.

If an isolation layer is formed using the micro pattern, there is a problem that a critical dimension (CD) becomes un-uniform due to an overlay. In addition, if the micro pattern is formed by a spacer, due to a difficulty of a layout, the micro pattern can be applied to only a simple line and space pattern or a two dimensional cell array having an excellent regularity.

SUMMARY OF THE INVENTION

The present invention provides a method of forming a micro pattern in a semiconductor device which forms a micro pattern that is applicable to a process for forming an isolation layer.

The method of forming a micro pattern in a semiconductor device according to the present invention comprises the steps of forming an etching object layer and a hard mask layer on a semiconductor substrate; forming cross-shaped first auxiliary patterns on the hard mask layer; forming an insulating layer on the hard mask layer including the first auxiliary pattern; forming a second auxiliary pattern on the insulating layer between the first auxiliary patterns; performing an etching process such that the insulating layer remains only on a lower portion of the second auxiliary pattern; etching the hard mask through an etching process using the first and second auxiliary patterns as an etching mask to form a hard mask pattern; and etching the etching object layer using the hard mask pattern as an etching mask.

In the above method, the first auxiliary patterns are arranged in a matrix shape on the hard mask. Each first auxiliary pattern comprises a linear vertical portion and a horizontal portion protruding from both sides of a central portion of the vertical portion. The horizontal portion and the vertical portion have different lengths. Each first auxiliary pattern is formed such that end portions thereof have a pointed-shape. The insulating layer has a thickness such that the insulating layer formed on a side wall of an end portion of the first auxiliary pattern comes in contact with the insulating layer formed on a side wall of an end portion of an adjacent first auxiliary pattern. The second auxiliary pattern has a shape that is the same as that of the first auxiliary pattern and is formed on a central portion of a tetragonal space among four adjacent first auxiliary patterns.

The method of forming a micro pattern in a semiconductor device according to the second embodiment comprises the steps of forming an etching object layer and a hard mask layer on a semiconductor substrate; forming first auxiliary patterns, wherein each first auxiliary pattern comprises a linear vertical portion and a horizontal portion protruding from both sides of a central portion of the vertical portion, the horizontal portion having a length which differs from that of the vertical portion; forming an insulating layer and a second auxiliary layer on the hard mask layer and the first auxiliary pattern; performing a first etching process such that the second auxiliary layer remains on the insulating layer between the first auxiliary patterns so that the remaining second auxiliary layer is a second auxiliary pattern having a shape that is the same as that of the first auxiliary pattern; removing the insulating layer on the first auxiliary pattern and between the first and second auxiliary patterns; etching the hard mask layer through a second etching process using the first and second auxiliary patterns as an etching mask to form a hard mask pattern; and etching the etching object layer through a third etching process using the hard mask pattern as an etching mask.

In the above method, the etching object layer comprises an insulating layer or a conductive layer. The hard mask layer has a stack structure comprising an amorphous carbon layer and a silicon oxide nitride (SiON) layer. The first auxiliary layer comprises a polysilicon layer or an oxide layer. The first auxiliary pattern has a critical dimension (CD) which is approximately half of a pitch of micro patterns formed through a final process. The first auxiliary patterns are arranged in a matrix shape on the hard mask layer. Each first auxiliary pattern is formed such that end portions thereof have a pointed-shape.

The insulating layer comprises a carbon layer. The insulating layer comprises material having an etching selection ratio which differs from that of material of the second auxiliary layer and the first auxiliary pattern. The insulating layer has a thickness which is approximately half of a pitch of micro patterns formed by a final process. The insulating layer has a thickness such that the insulating layer formed on a side wall of an end portion of the first auxiliary pattern comes in contact with the insulating layer formed on a side wall of an end portion of the adjacent first auxiliary pattern.

The second auxiliary layer comprises conductive material or insulative material. The second auxiliary layer comprises a bottom anti-reflective coating (BARC) containing spin on glass (SOG) material or silicon (Si). A step of performing a baking process after a deposition process is further performed if the second auxiliary layer is formed from spin on glass (SOG) material. The bake process is performed at a temperature of 150° C. to 400° C.

The second auxiliary layer is etched by an etchback process. The second auxiliary pattern is leveled with the first auxiliary pattern during the first etching process. The insulating layer is removed through a dry etching process in which $O_2$ plasma is utilized. The insulating layer has an etching selection ratio which differs from those of the first auxiliary pattern and the second auxiliary layer during the first etching process and the process for removing the insulating layer. The second auxiliary pattern is formed on a central portion of a tetragonal space among four adjacent first auxiliary patterns. The second etching process is a dry etching process. The etching object layer and a portion of the semiconductor substrate are etched to form a trench for an isolation layer during the third etching process.

The method of forming a micro pattern in a semiconductor device according to the third embodiment comprises the steps of forming an etching object layer and a hard mask layer on a semiconductor substrate on which a cell area and a periphery circuit area are defined; forming first auxiliary patterns on the hard mask layer, wherein each first auxiliary pattern comprises a linear vertical portion and a horizontal portion protruding from both sides of a central portion of the vertical portion, the horizontal portion having a length which differs from that of the vertical portion; forming an insulating layer and a second auxiliary layer on the hard mask layer and the first auxiliary pattern; removing the second auxiliary layer formed on the periphery circuit area; performing a first etching process such that the second auxiliary layer formed on the cell area remains on the insulating layer between the first auxiliary patterns so that the remaining second auxiliary layer is a second auxiliary pattern having a shape that is the same as that of the first auxiliary pattern; removing the insulating layer on the first auxiliary pattern and the insulating layer between the first and second auxiliary patterns in the cell area; etching the hard mask layer through a second etching process using the first and second auxiliary patterns as an etching mask to form a hard mask pattern; and etching the etching object layer through a third etching process using the hard mask pattern as an etching mask.

In the above method, the etching object layer comprises an insulating layer or a conductive layer. The hard mask layer has a stack structure comprising an amorphous carbon layer and a silicon oxide nitride (SiON) layer. The first auxiliary layer comprises a polysilicon layer or an oxide layer. The first auxiliary pattern has a critical dimension (CD) which is approximately half of a pitch of micro patterns formed through a final process. The first auxiliary patterns are arranged in a matrix shape on the hard mask layer. Each first auxiliary pattern is formed such that end portions thereof have a pointed-shape.

The insulating layer comprises a carbon layer. The insulating layer comprises material having an etching selection ratio which differs from that of material of the second auxiliary layer and the first auxiliary pattern. The insulating layer has a thickness which is approximately half of a pitch of micro patterns formed by a final process. The insulating layer has a thickness such that the insulating layer formed on a side wall of an end portion of the first auxiliary pattern comes in contact with the insulating layer formed on a side wall of an end portion of the adjacent first auxiliary pattern.

The second auxiliary layer comprises conductive material or insulative material. The second auxiliary layer comprises a bottom anti-reflective coating (BARC) containing spin on glass (SOG) material or silicon (Si). The step of performing a baking process after a deposition process is further performed if the second auxiliary layer comprises spin on glass (SOG) material. The bake process is performed at a temperature of 150° C. to 400° C. The second auxiliary layer formed on the periphery circuit area is removed through a dry etching process using the insulating layer as an etching mask. The insulating layer formed on the periphery circuit area is removed during the process for etching the second auxiliary layer formed on the cell area. The second auxiliary pattern is leveled with the first auxiliary pattern during the first etching process. The insulating layer has an etching selection ratio which differs from those of the first auxiliary pattern and the second auxiliary layer during the first etching process and the process for removing the insulating layer. The second auxiliary pattern is formed on a central portion of a tetragonal space among four adjacent first auxiliary patterns. The second etching process is a dry etching process. The etching object layer and a portion of the semiconductor substrate are etched to form a trench for an isolation layer during the third etching process.

BRIEF DESCRIPTION OF THE DRAWINGS

The above and other features and advantages of the present invention will become readily apparent by reference to the following detailed description when considered in conjunction with the accompanying drawings wherein:

FIG. 3A to FIG. 3J are plane views of a semiconductor device for illustrating a method of forming a micro pattern in a semiconductor device according to a second embodiment of the present invention.

DESCRIPTION OF SPECIFIC EMBODIMENTS

Embodiments of the present invention will be explained in detail with reference to the accompanying drawings.

FIG. 1A to FIG. 1H are plane views of a semiconductor device for illustrating a method of forming a micro pattern in a semiconductor device according to the first embodiment of the present invention, and FIG. 2A to FIG. 2H are sectional views taken along the line A-A in FIG. 1A to FIG. 1H. Below, a process limited to a cell gate area will be described.

Figure 1A:
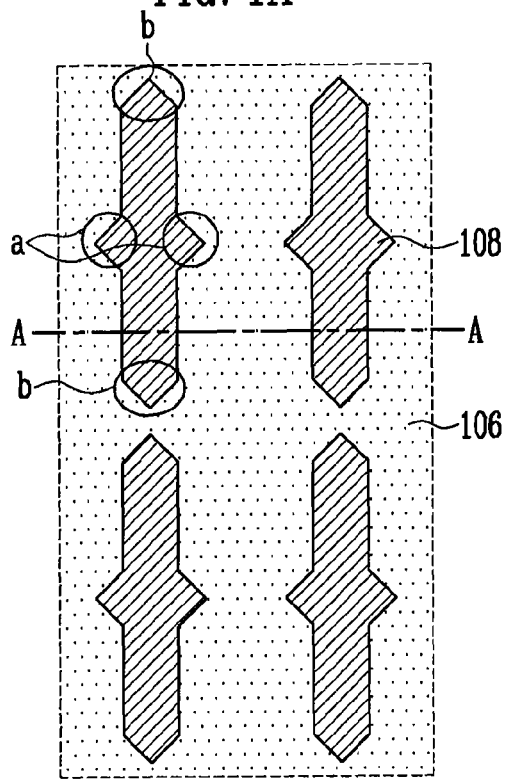
FIG. 1A to FIG. 1H are plane views of a semiconductor device for illustrating a method of forming a micro pattern in a semiconductor device according to a first embodiment of the present invention.
Figure 2A:
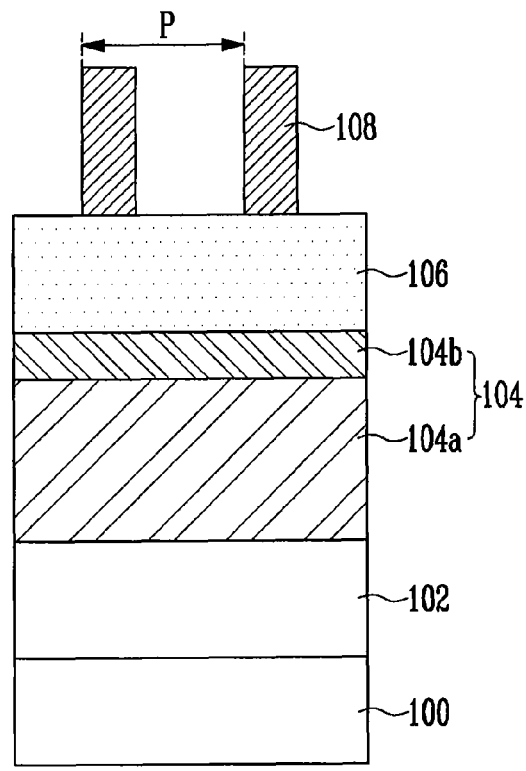
FIG. 2A to FIG. 2H are sectional views taken along the line A-A in FIG. 1A to FIG. 1H.

Referring to FIG. 1A and FIG. 2A, an etching object layer 102, a hard mask layer 104 and a first auxiliary layer 106 are sequentially formed on a semiconductor substrate 100. The hard mask layer 104 has a stack structure consisting of an amorphous carbon layer 104a and a silicon oxide nitride (SiON) layer 104b, and the first auxiliary layer 106 is formed of a polysilicon layer or an oxide layer. When the first auxiliary layer 106 is formed of the polysilicon layer, it is impossible to align a wafer during a process of forming a photoresist pattern since the polysilicon layer is opaque. Accordingly, a process for removing the polysilicon layer should be additionally performed for aligning the wafer. However, when the first auxiliary layer 106 is formed of the oxide layer, it is possible to align a wafer during a process of forming a photoresist pattern since the oxide layer is transparent. Accordingly, there is no need to perform a process for removing the polysilicon layer for aligning the wafer.

Photoresist patterns 108 are formed on the first auxiliary layer 106. The photoresist patterns 108 are formed such that a pitch "p" between the photoresist patterns 108 is twice as large as a pitch between target micro patterns to be formed. The above structure will be described in more detail. The photoresist patterns 108 are arranged in a matrix shape. Each photoresist pattern 108 comprises a linear vertical portion and a horizontal portion protruding from both sides of a central portion of the vertical portion so that the photoresist pattern has a cross shape. A length of the horizontal portion of the photoresist pattern 108 is larger than a width of the vertical portion. A dimension of the horizontal portion is adjusted such that a width of a central portion of the photoresist pattern is 1.1 to 2 times as large as that of the width of the vertical portion. End portions ("a" and "b" in FIG. 1A) of the horizontal portion and the vertical portion of the photoresist pattern 108 may have a pointed-shape. In addition, it is preferable that the cross-shaped photoresist pattern 108 is formed such that the vertical portion is longer than the horizontal portion.

Due to the above described shape of the photoresist pattern 108, a pattern having a shape which is the same as that of the photoresist pattern 108 is automatically formed between the photoresist patterns 108 in a subsequent process. Details of which are described later.

Figure 1B:
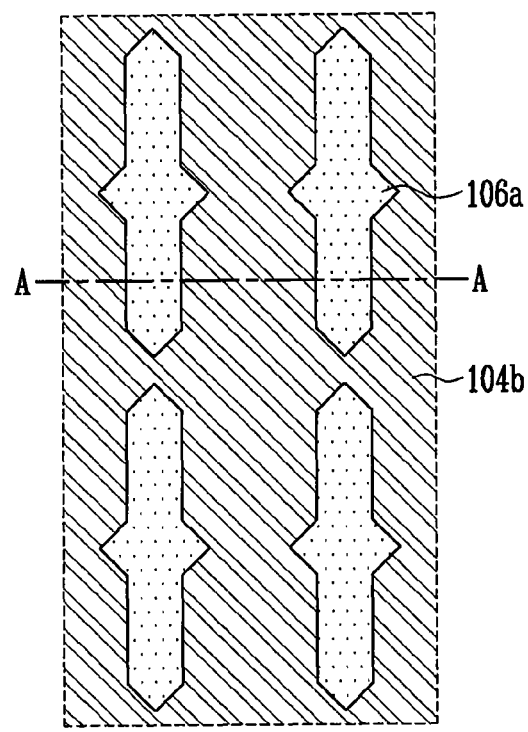
Figure 1C:
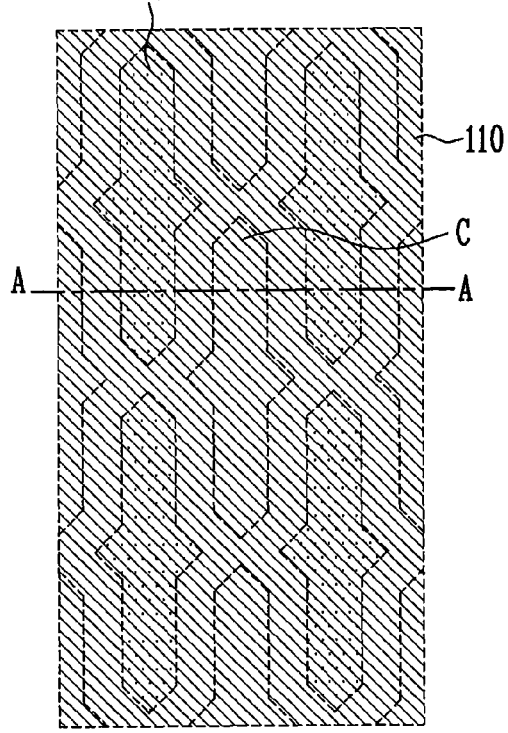
Figure 2B:
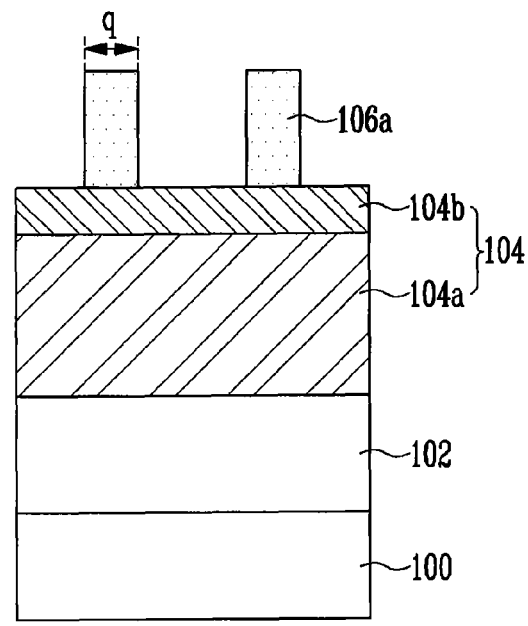

Referring to FIG. 1B and FIG. 2B, the first auxiliary layer 106 is etched using the photoresist pattern 108 as an etching mask to form first auxiliary patterns 106a having a cross shape which is the same as the shape of photoresist pattern 108. Then, photoresist patterns 108 are removed. It is desirable that a critical dimension "q" of the first auxiliary pattern 106a is approximately half of a pitch of micro patterns to be formed in a final process.

Figure 2C:
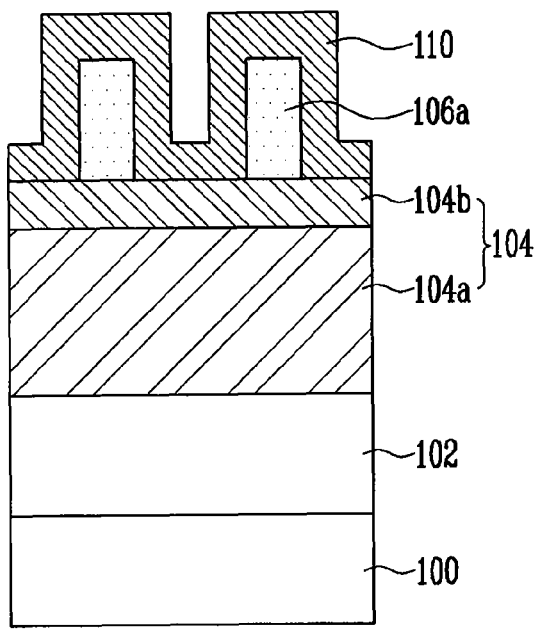

Referring to FIG. 5C and FIG. 2C, an insulating layer 110 is formed on surfaces of the hard mask layer 104 and the first auxiliary patterns 106a. It is preferable that the insulating layer 110 is formed of a carbon layer. An etching selection ratio of the carbon layer differs from those of the first auxiliary pattern 106a and a second auxiliary layer to be formed in a subsequent process. In a subsequent etching process, accordingly, the insulating layer 110 can be removed while the carbon layer prevents the first auxiliary pattern 106a from being damaged. In the present invention, for the above reason, the carbon layer is utilized as the insulating layer 110. Accordingly, it is desirable that the insulating layer 110 is formed from material whose etching selection ratio differs from those of material used for forming the second auxiliary layer and the first auxiliary pattern 106a. The insulating layer 110 has a thickness such that the insulating layer 110 formed on a side wall of an end portion of the first auxiliary pattern 106a comes in contact with the insulating layer 110 formed on a side wall of an end portion of the adjacent first auxiliary pattern 106a, and a thickness of the insulating layer 110 is approximately half of a pitch of the micro patterns to be formed in a final process. If the insulating layer 110 having the thickness as described above is formed, a recess ("c" in FIG. 1C) having a shape which is the same as that of the first auxiliary pattern 106a is formed on a space among the four adjacent first auxiliary patterns 106a. That is, the recess C having a shape which is the same as that of the first auxiliary pattern 106a is formed on the silicon oxide nitride (SiON) layer 104b between the first auxiliary patterns 106a.

Figure 1D:
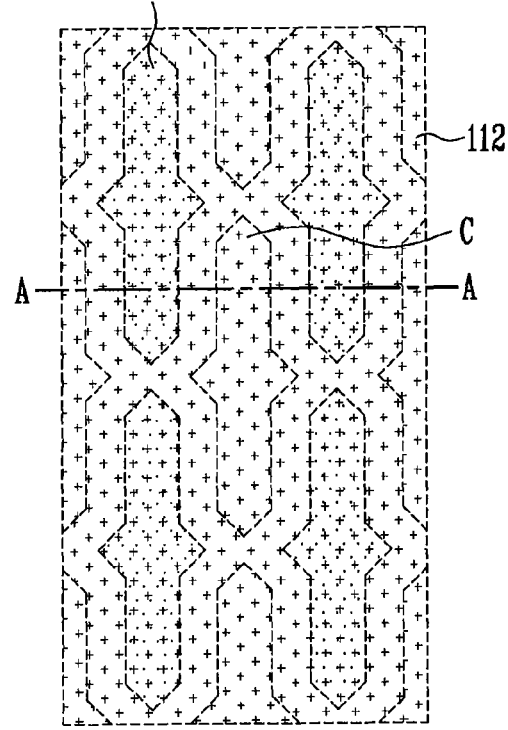
Figure 2D:
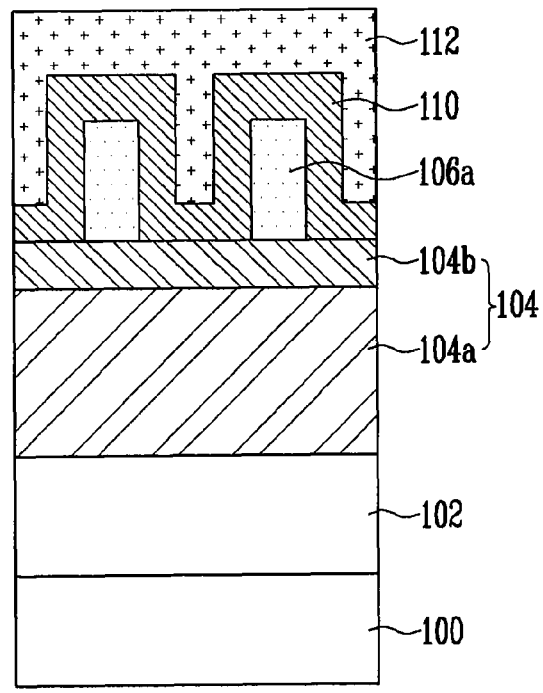

Referring to FIG. 1D and FIG. 2D, a second auxiliary layer 112 is formed on the insulating layer 110 to fill a gap between the first auxiliary patterns 106a. The second auxiliary layer 112 is formed from conductive material or insulative material. Preferably, the second auxiliary layer 112 is formed from spin on glass (SOG) material having an excellent gap-fill characteristic or bottom anti reflective coating (BARC) containing silicon (Si). Since a great deal of contaminants and moisture are contained in spin on glass (SOG) material, in a case where SOG material is utilized, a bake process should be performed for removing contaminants and moisture after a deposition process. The bake process is performed at a temperature of 150° C. to 400° C. to prevent the carbon layer acting as the insulating layer 110 from being dissolved.

Figure 1E:
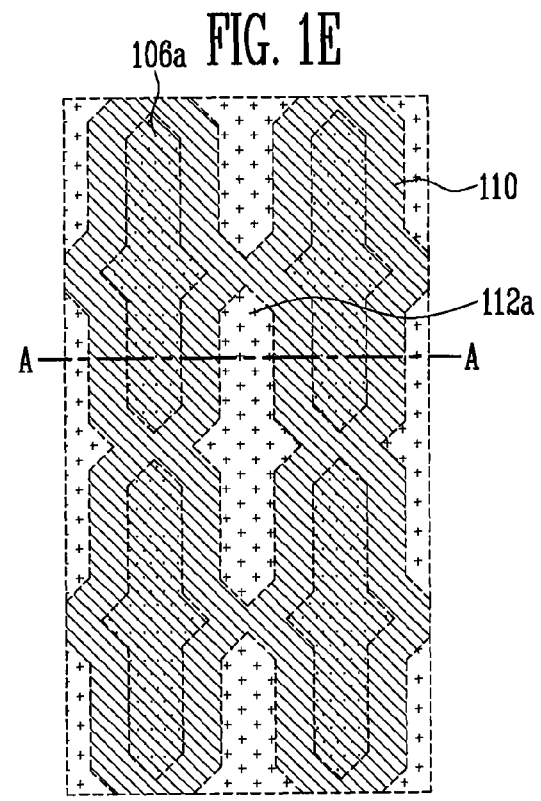
Figure 2E:
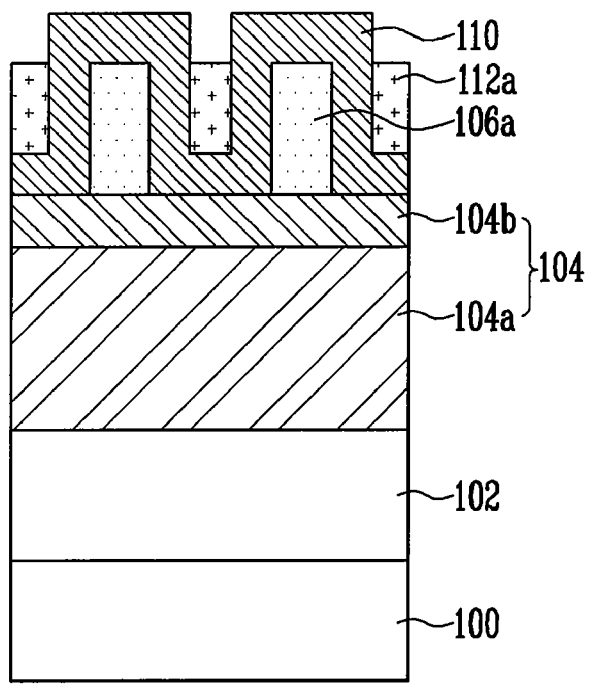

Referring to FIG. 1E and FIG. 2E, the second auxiliary layer is etched using an etchback process until an upper portion of the insulating layer 110 is exposed to form the second auxiliary patterns 112a. While etching the second auxiliary layer, the second auxiliary pattern 112a formed between the insulating layers 110 is leveled with the first auxiliary pattern 106a. Consequently, the second auxiliary layer remains only on an area on which the recess C described with reference to FIG. 1D and FIG. 2D is generated. As a result, the second auxiliary pattern 112a is formed in a shape which is the same as that of the first auxiliary pattern 106a. That is, the second auxiliary pattern 112a having a shape which is the same as that of the first auxiliary pattern 106 is formed on a central portion of a tetragonal space among four adjacent first auxiliary patterns 106a.

Figure 1F:
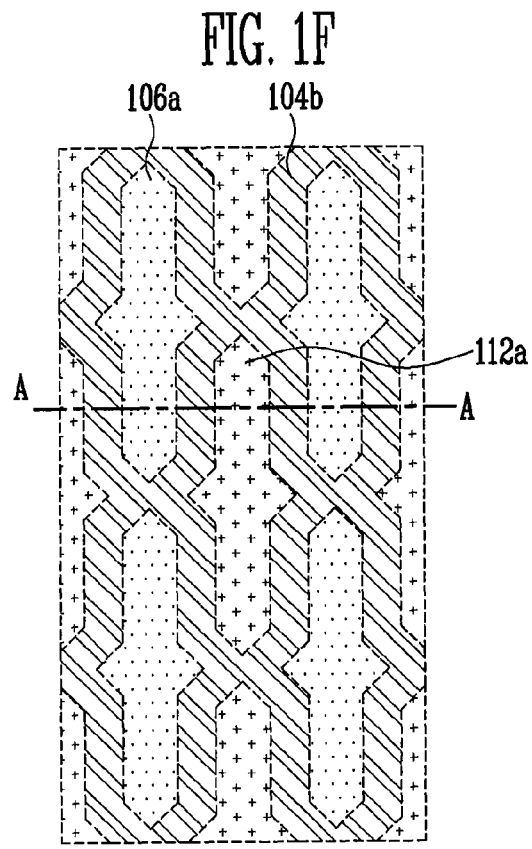
Figure 2F:
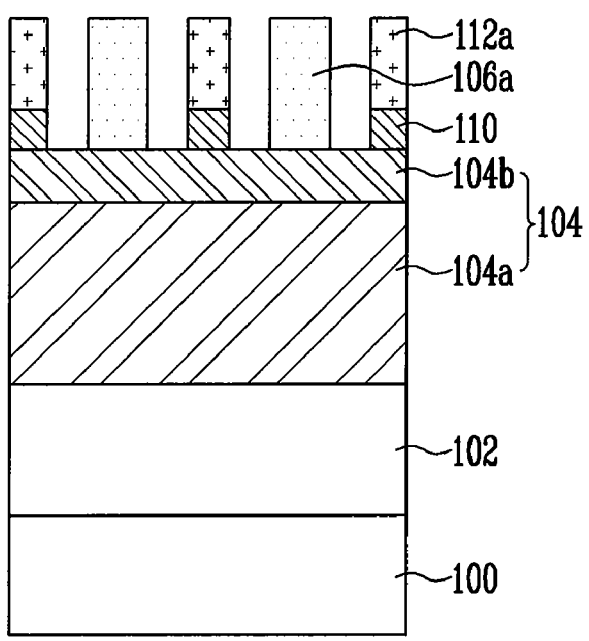

Referring to FIG. 1F and FIG. 2F, after forming the second auxiliary pattern 112a, the exposed insulating layer 110 and the layer 110 formed between the first auxiliary pattern 106a and the second auxiliary pattern 112a are removed such that the insulating layer 100 remains below only the second auxiliary pattern 112a. The insulating layer 110 is removed through a dry etching process in which $O_2$ plasma is utilized. During the process for etching the insulating layer 110, the insulating layer 110 has an etching selection ratio which differs from those of the first auxiliary patterns 106a and the second auxiliary pattern 112a. Accordingly, the first auxiliary patterns 106a and the second auxiliary pattern 112a are not etched. As described above, by forming the second auxiliary patterns 112a having the shape which is the same as that of the first auxiliary pattern 106a between the first auxiliary patterns 106a, the patterns having a predetermined pitch are formed.

Figure 1G:
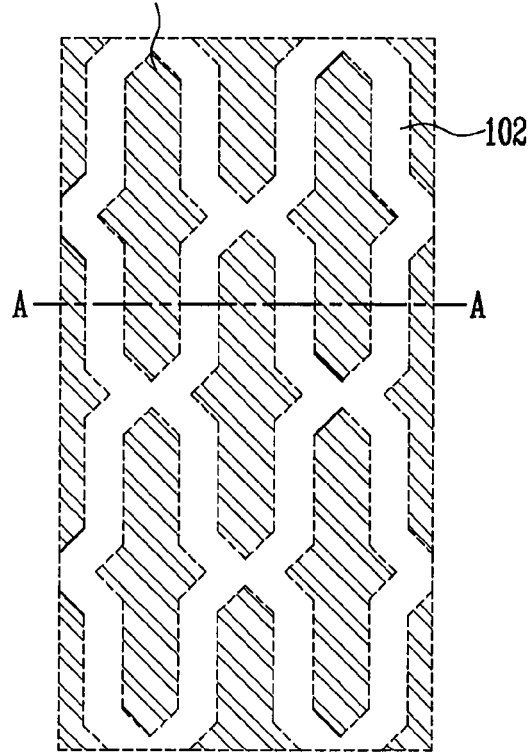
Figure 2G:
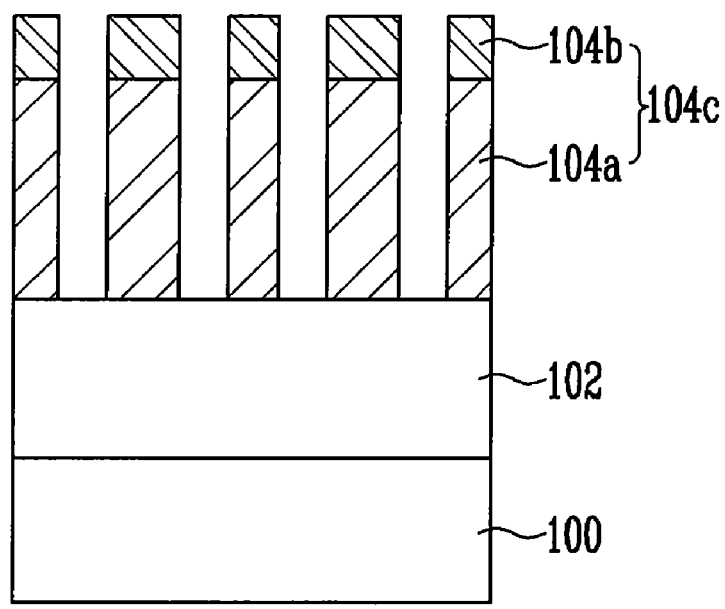

Referring to FIG. 1G and FIG. 2G, the hard mask layer 104 is etched using the first auxiliary pattern 106a and the second auxiliary pattern 112a as an etching mask to form the hard mask patterns 104c having a desired line and space. The hard mask layer 104 is removed through a dry etching process. Subsequently, the first auxiliary pattern 106a, the insulating layer 110 and the second auxiliary pattern 112a are removed.

Figure 1H:
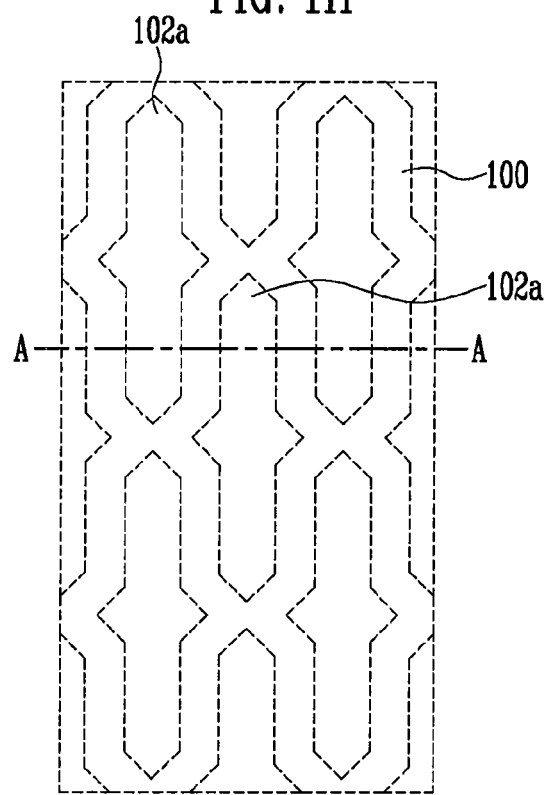
Figure 2H:
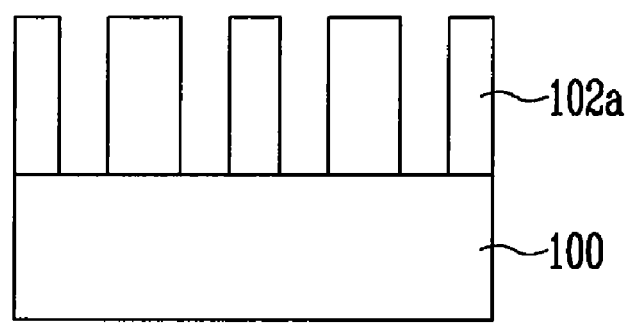

Referring to FIG. 1H and FIG. 2H, the etching object layer 102 is etched using the hard mask patterns 104c having the desired and space as an etching mask to form desired target patterns 102a. The hard mask patterns 104c are then removed.

Although not shown in the drawings, it is possible to etch a part of the semiconductor substrate 100 using the target patterns 102a as an etching mask to form a trench for an isolation layer.

As described above, by forming the second auxiliary pattern 112a having a shape which is the same as that of the first auxiliary pattern 106a between the first auxiliary patterns 106a, the micro pattern having a desired critical dimension (CD) can be formed and the above method is applicable to a process for forming an isolation layer. In addition, since the above method can form a pattern which is finer than a resolution of conventional exposure equipment and is applicable to a process for forming the isolation layer, a resolution limit of the exposure equipment can be overcome. Further, without developing exposure equipment having excellent resolution characteristics, the micro pattern can be formed by conventional exposure equipment.

FIG. 3A to FIG. 3J are plane views of a semiconductor device for illustrating a method of forming a micro pattern in a semiconductor device according to the second embodiment of the present invention, and FIG. 4A to FIG. 4J are sectional views taken along the lines B-B and C-C in FIG. 3A to FIG. 3J.

Figure 3A:
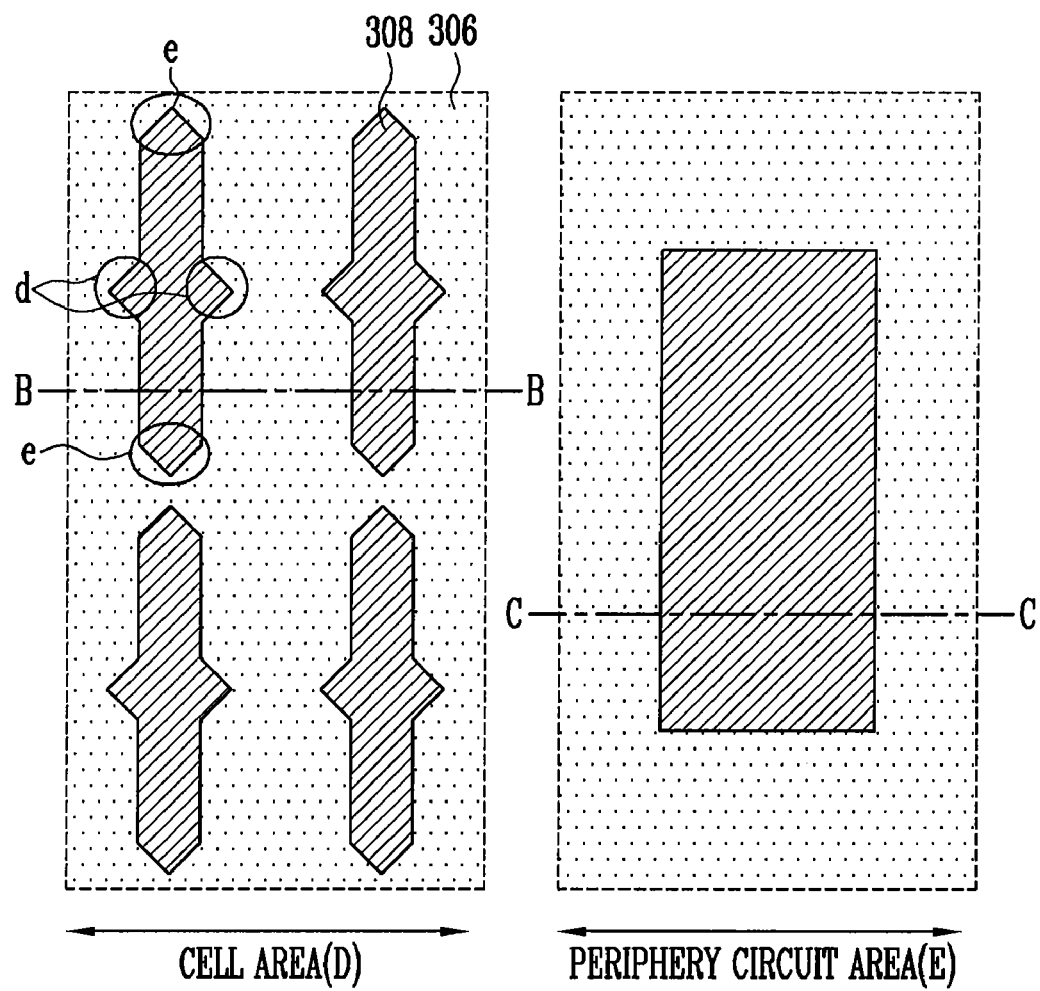
Figure 4A:
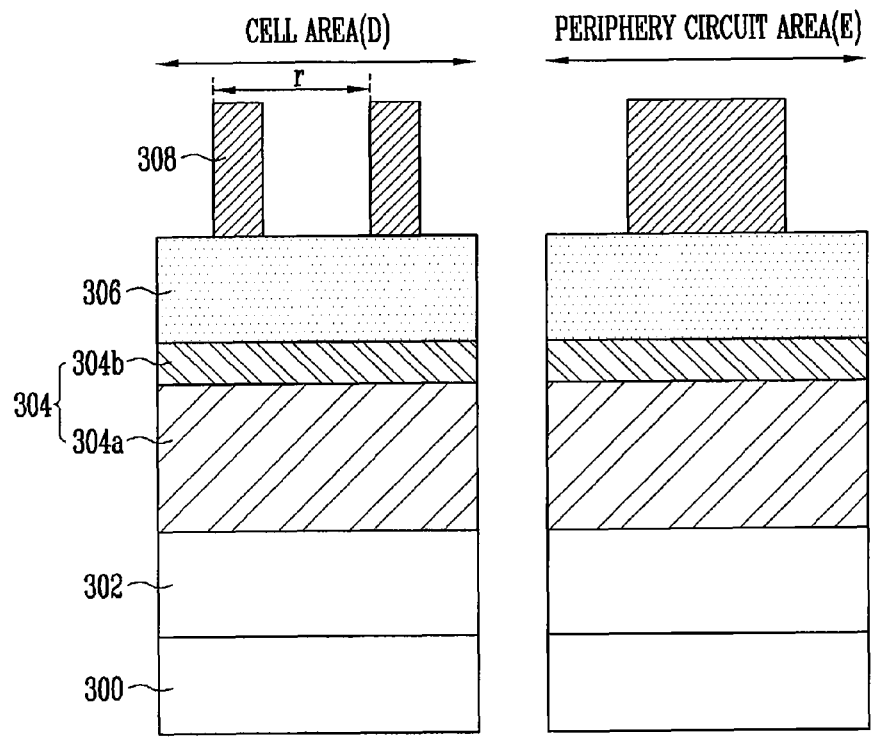
FIG. 4A to FIG. 4J are sectional views taken along the lines B-B and C-C in FIG. 3A to FIG. 3J.

Referring to FIG. 3A and FIG. 4A, an etching object layer 302, a hard mask layer 304 and a first auxiliary layer 306 are sequentially formed on a semiconductor substrate 300 on which a cell area D and a periphery circuit E area are defined. The hard mask layer 304 has a stack structure consisting of an amorphous carbon layer 304a and a is silicon oxide nitride (SiON) layer 304b, and the first auxiliary layer 306 is formed of a polysilicon layer or an oxide layer. When the first auxiliary layer 306 is formed of the polysilicon layer, it is impossible to align a wafer during a process of forming a first photoresist pattern since the polysilicon layer is opaque. Accordingly, a process for removing the polysilicon layer should be additionally performed for aligning the wafer. However, when the first auxiliary layer 306 is formed of the oxide layer, it is possible to align a wafer during a process of forming a first photoresist pattern since the oxide layer is transparent. Accordingly, there is no need to perform a process for removing the polysilicon layer for aligning the wafer.

First photoresist patterns 308 are formed on the first auxiliary layer 306. The first photoresist patterns 308 are formed such that a pitch "r" between the first photoresist patterns 308 is twice as large as a pitch between the target micro patterns to be formed on the cell area D. The above structure will be described in more detail. The first photoresist patterns 308 are arranged in a matrix shape. Each first photoresist pattern 308 comprises a linear vertical portion and a horizontal portion protruding from both sides of a central portion of the vertical portion so that the photoresist pattern has a cross shape. A length of the horizontal portion of the photoresist pattern 308 is larger than a width of the vertical portion. A dimension of the horizontal portion is adjusted such that a width of a central portion of the photoresist pattern is 1.1 to 2 times as large as that of the width of the vertical portion. End portions ("d" and "ee" in FIG. 3A) of the horizontal portion and the vertical portion of the first photoresist pattern 308 can be formed in a pointed shape. In addition, it is preferable that the cross-shaped first photoresist pattern 308 is formed such that the vertical portion is longer than the horizontal portion.

Due to the above described shape of the first photoresist pattern 308, a pattern having a shape which is the same as that of the first photoresist pattern 308 is automatically formed between the first photoresist patterns 108 in a subsequent process. Details of which are described later.

Figure 3B:
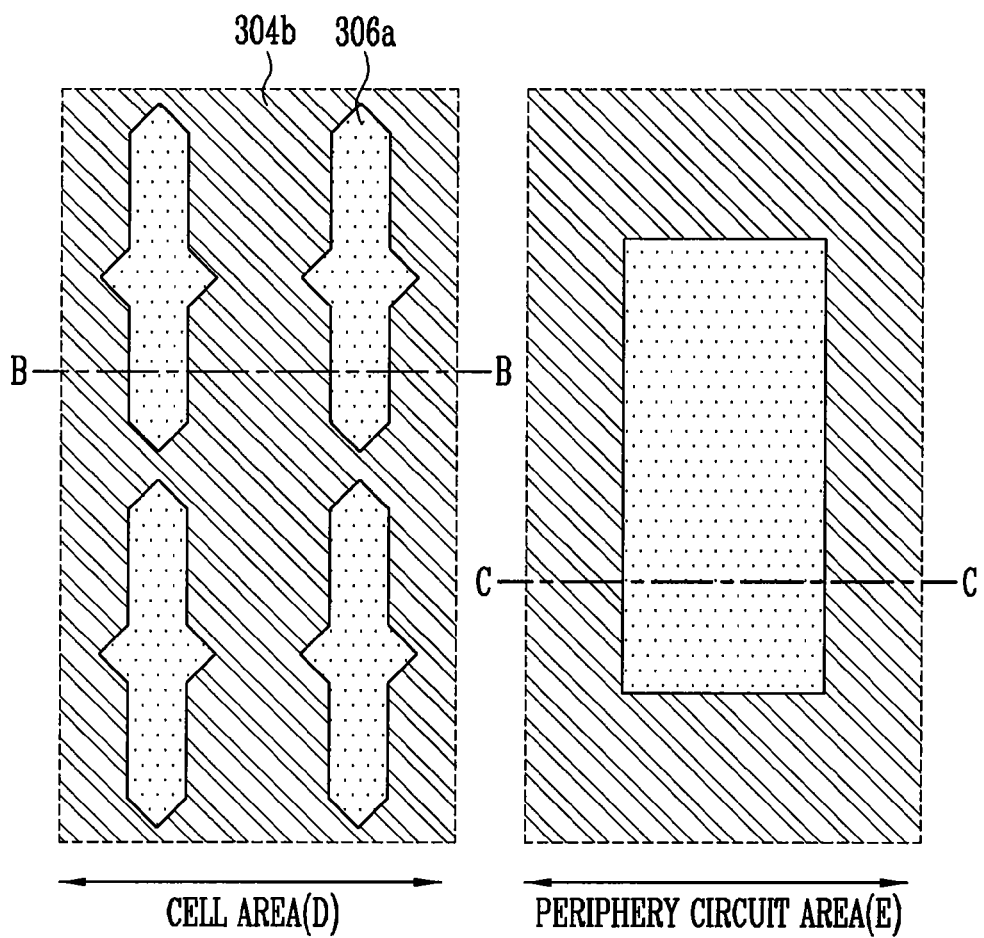
Figure 4B:
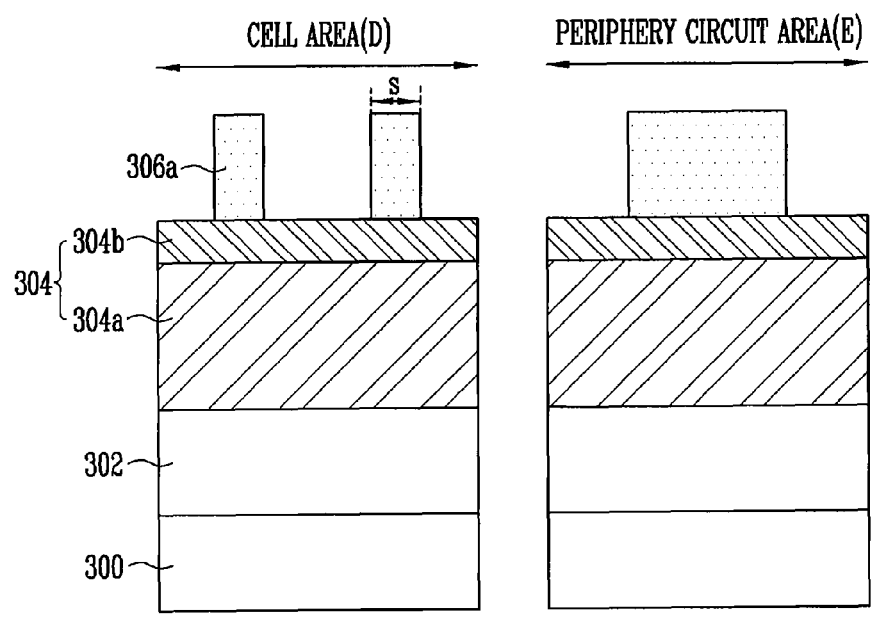

Referring to FIG. 3B and FIG. 4B, the first auxiliary layer 306 is etched using the first photoresist pattern 308 as an etching mask to form first auxiliary patterns 306a having a cross shape which is the same as that of first photoresist pattern 308. First photoresist patterns 308 are then removed. It is desirable that a critical dimension of the first auxiliary pattern 306a is approximately half of a pitch of micro patterns to be formed in a final process.

Figure 3C:
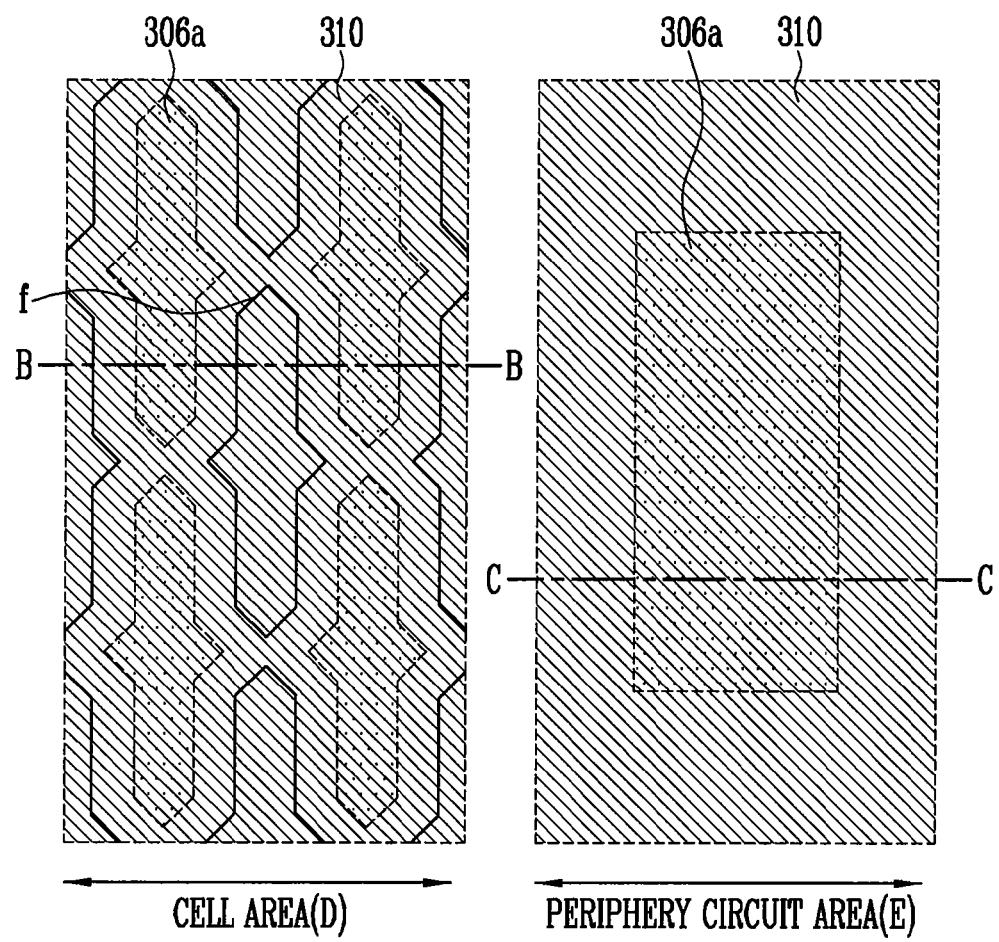
Figure 4C:
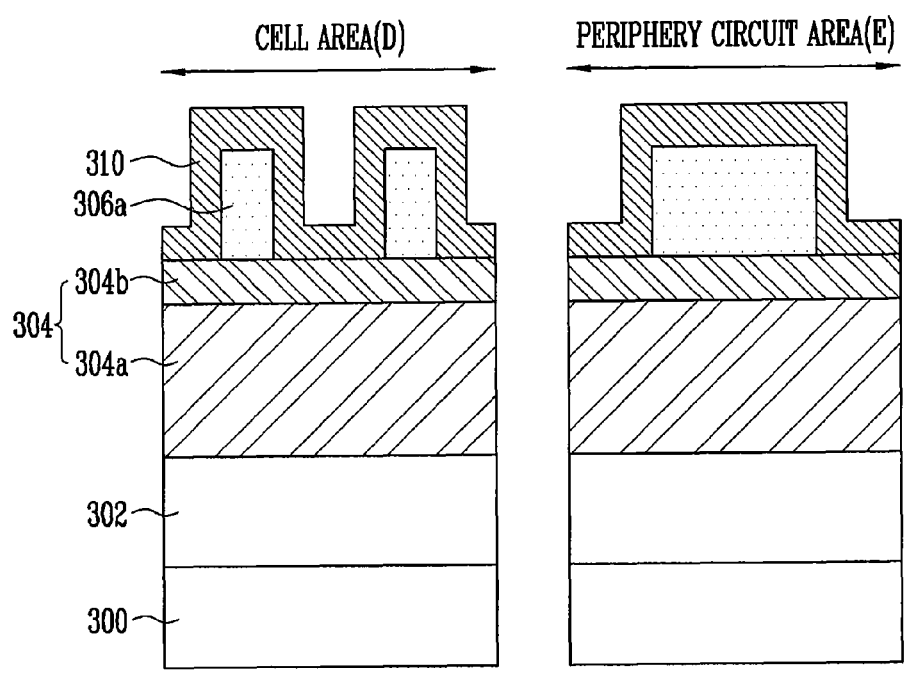

Referring to FIG. 3C and FIG. 4C, an insulating layer 310 is formed on surfaces of the hard mask layer 304 and the first auxiliary patterns 306a. It is preferable that the insulating layer 310 is formed of a carbon layer. An etching selection ratio of the carbon layer differs from those of the first auxiliary pattern 306a and a second auxiliary layer to be formed in a subsequent process. In a subsequent etching process, accordingly, the insulating layer 310 can be removed while the carbon layer prevents the first auxiliary pattern 306a from being damaged. In the present invention, for the above reason, the carbon layer is utilized as the insulating layer 310. Accordingly, it is desirable that the insulating layer 310 is formed from material whose etching selection ratio differs from those of material used for forming the second auxiliary layer and the first auxiliary pattern 306a. The insulating layer 310 has a thickness such that the insulating layer 310 formed on a side wall of an end portion of the first auxiliary pattern 306a comes in contact with the insulating layer 310 formed on a side wall of an end portion of the adjacent first auxiliary pattern 306a, and a thickness of the insulating layer 310 is approximately half of a pitch of micro patterns to be formed in a final process. If the insulating layer 310 having the thickness as described above is formed, a recess ("f" in FIG. 3C) having a shape which is the same as that of the first auxiliary pattern 306a is formed on a space among four adjacent first auxiliary patterns 306a. That is, the recess "f" having a shape which is the same as that of the first auxiliary pattern 306a is formed on the silicon oxide nitride (SiON) layer 304b between the first auxiliary patterns 306a.

Figure 3D:
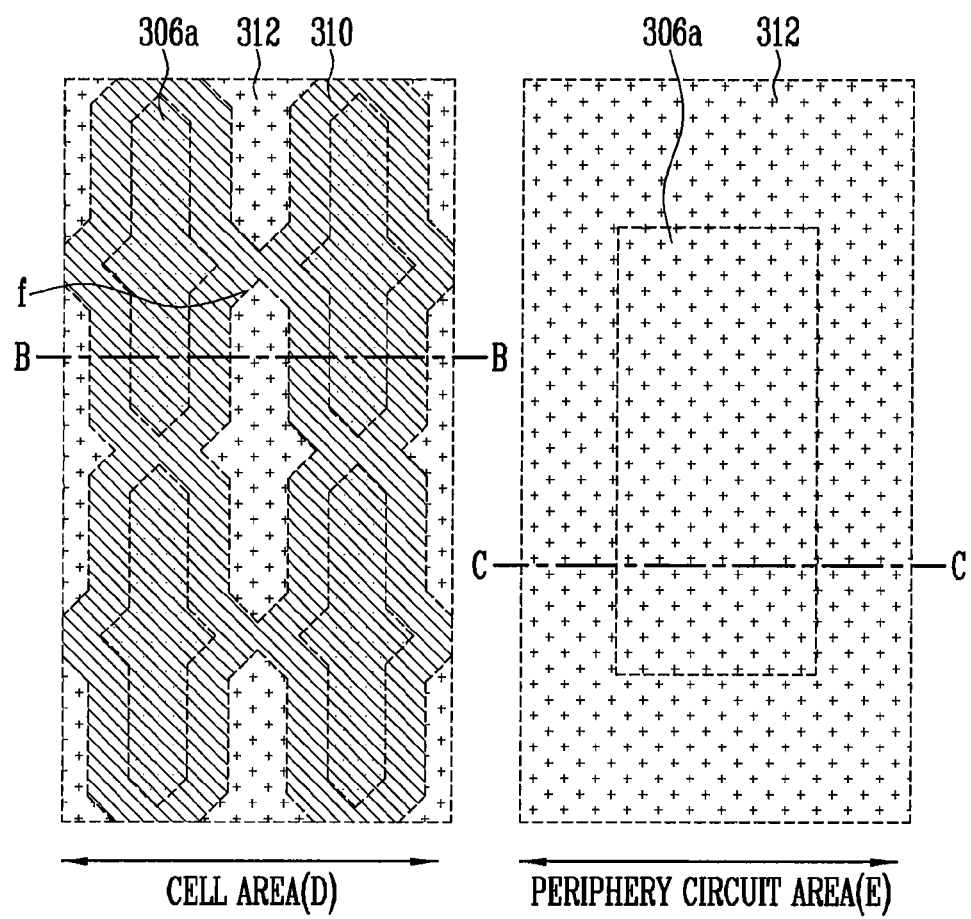
Figure 4D:
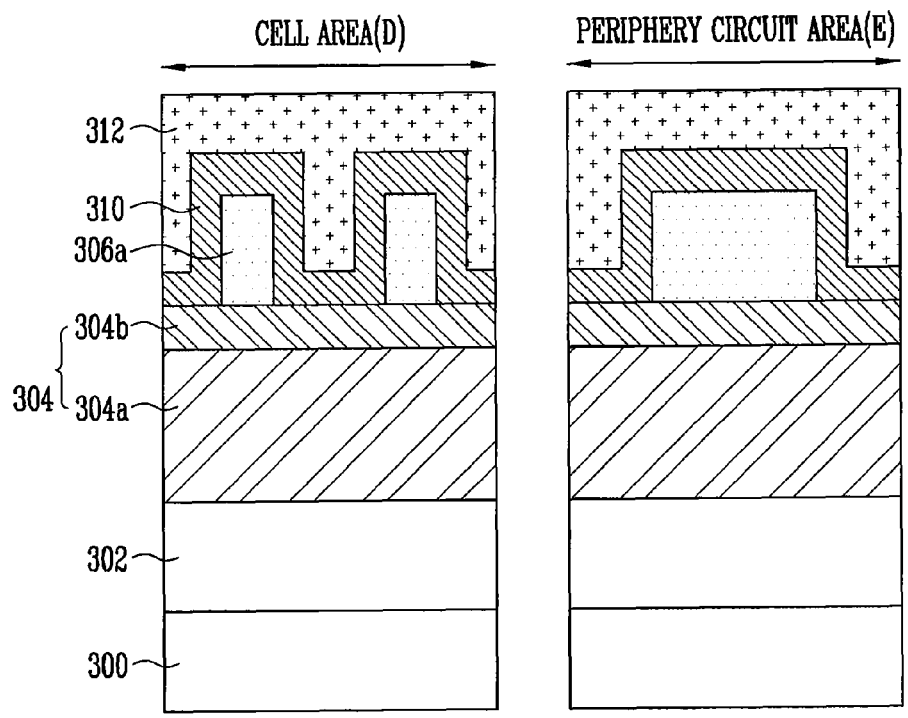

Referring to FIG. 3D and FIG. 4D, a second auxiliary layer 312 is formed on the insulating layer 310 to fill a gap between the first auxiliary patterns 306a. The second auxiliary layer 312 is formed from conductive material or insulative material. Preferably, the second auxiliary layer 312 is formed from spin on glass (SOG) material having an excellent gap-fill characteristic or bottom anti reflective coating (BARC) containing silicon (Si). Since a great deal of contaminants and moisture are contained in spin on glass (SOG) material, in a case where SOG material is utilized, a bake process should be performed for removing contaminants and moisture after a deposition process. The bake process is performed at a temperature of 150° C. to 400° C. to prevent the carbon layer acting as the insulating layer 310 from being dissolved.

Figure 3E:
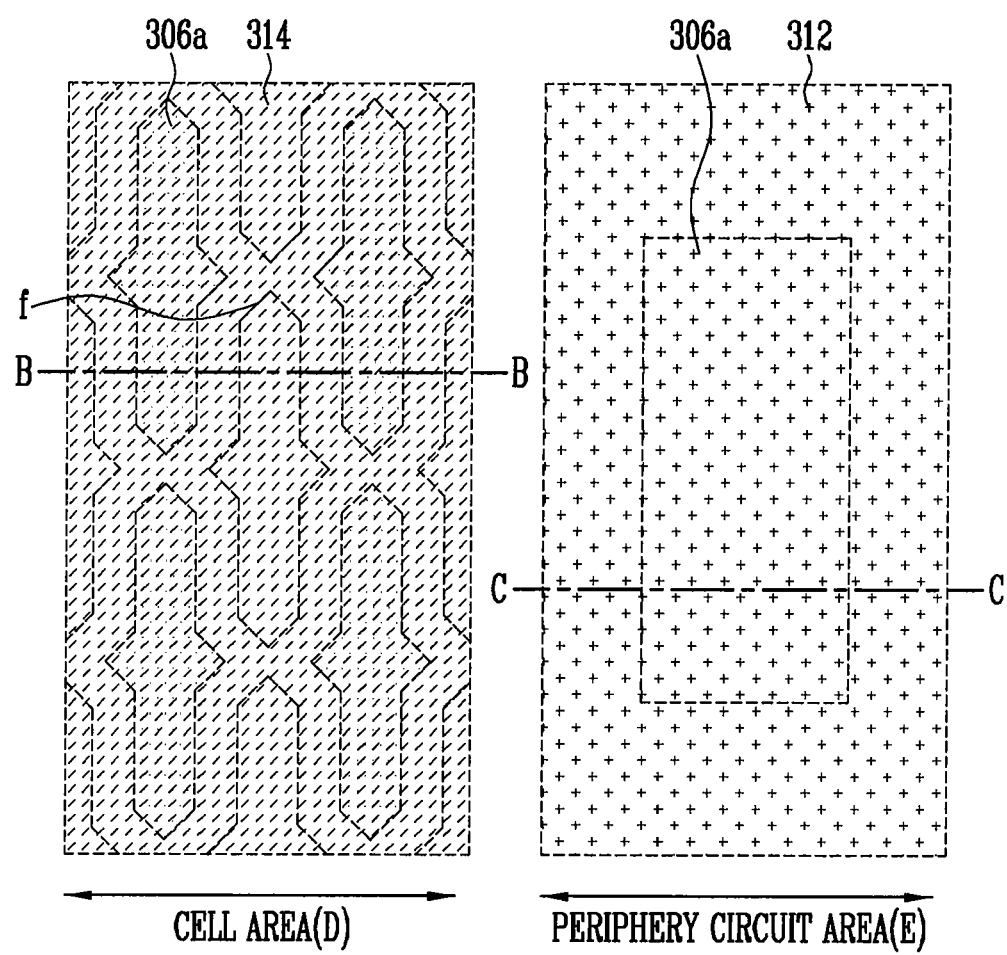
Figure 4E:
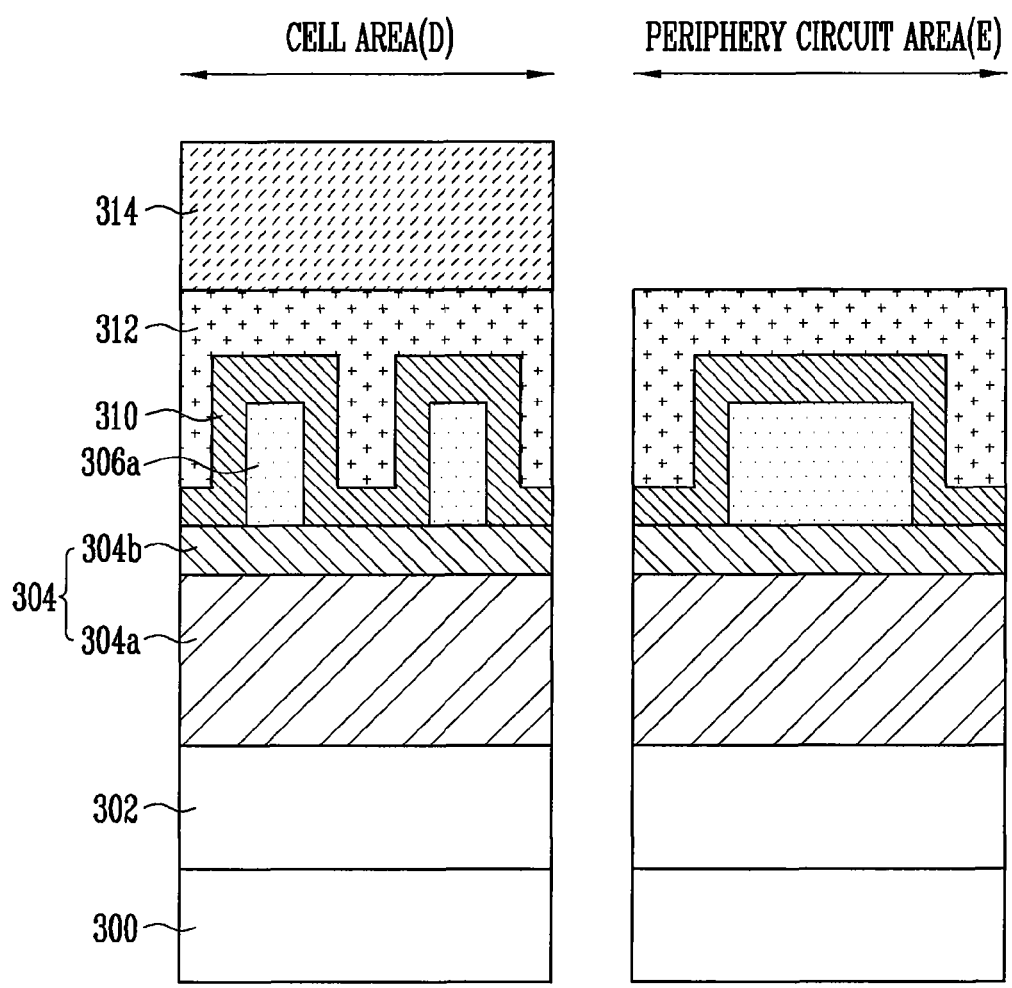

Referring to FIG. 3E and FIG. 4E, second photoresist patterns 314 are formed on the second auxiliary layer 312 of the cell area D to open the periphery circuit area E for preventing a micro pattern from being formed on the periphery circuit area E in a subsequent process.

Figure 3F:
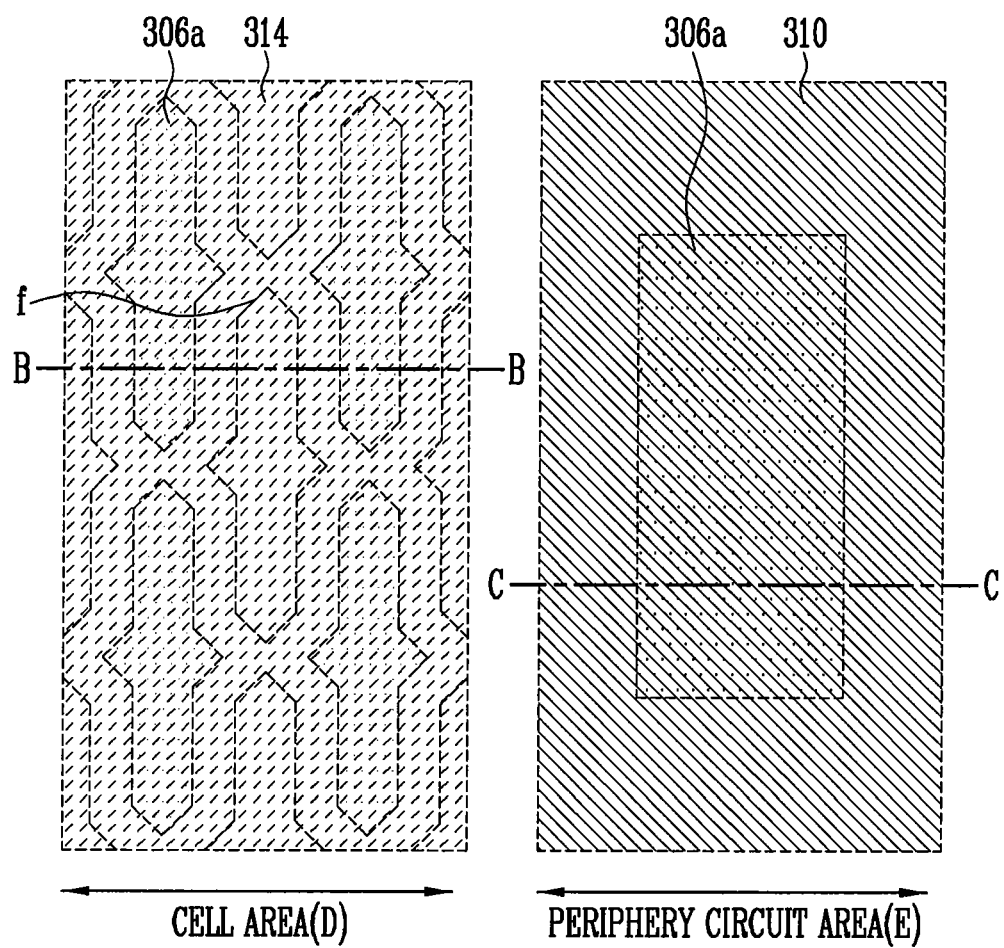
Figure 4F:
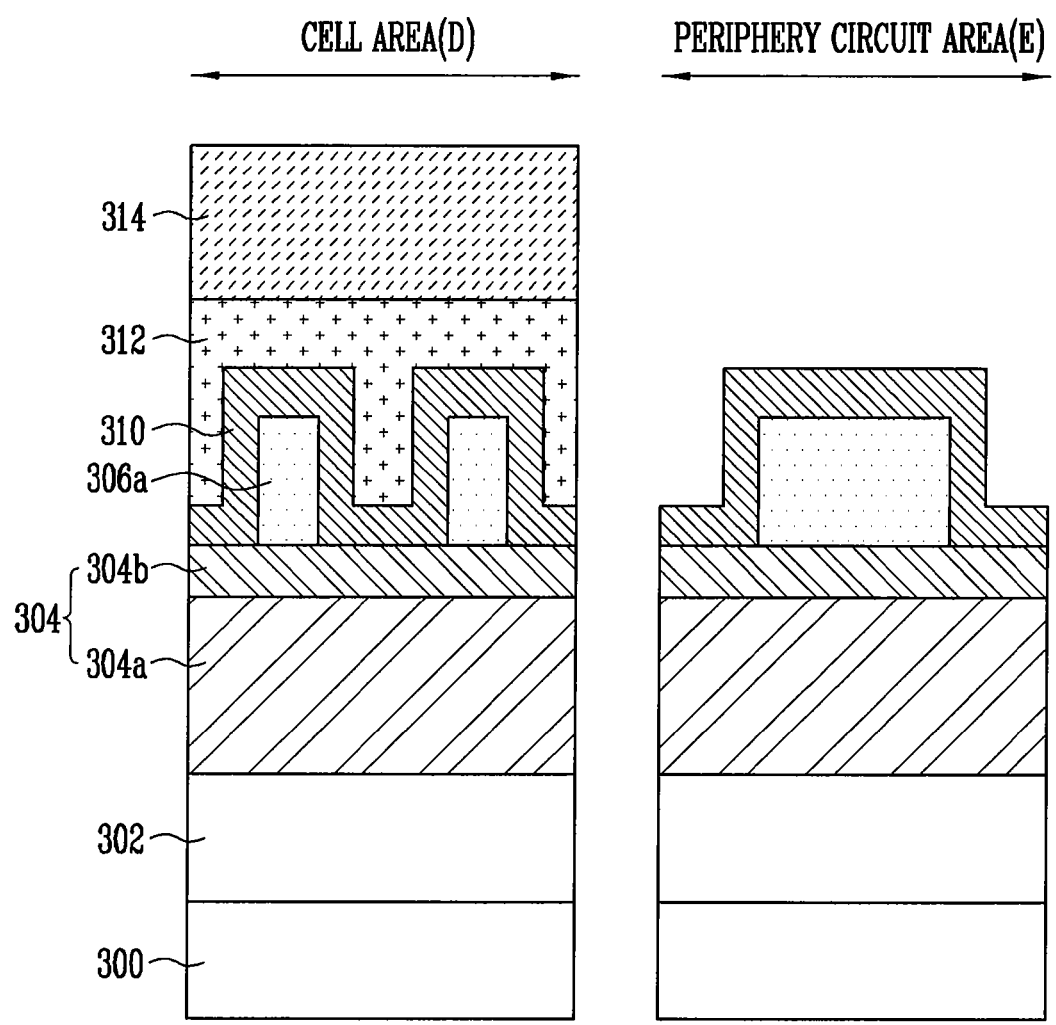

Referring to FIG. 3F and FIG. 4F, the second auxiliary layer 312 formed on the periphery circuit area E is etched using the second photoresist patterns 314 as an etching mask. The second auxiliary layer 212 is removed through a dry etching process using the insulating layer 310 as an etching mask. The insulating layer has an etching selection ratio which differs from that of the second auxiliary layer 312.

Figure 3G:
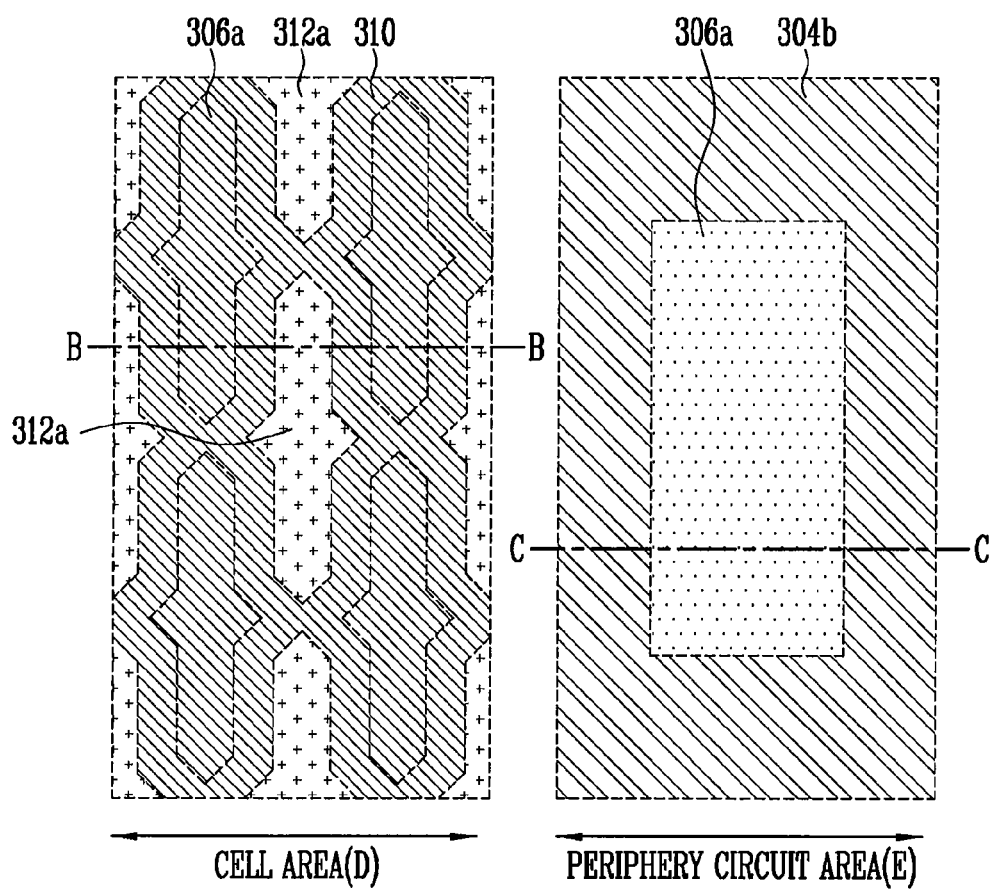
Figure 4G:
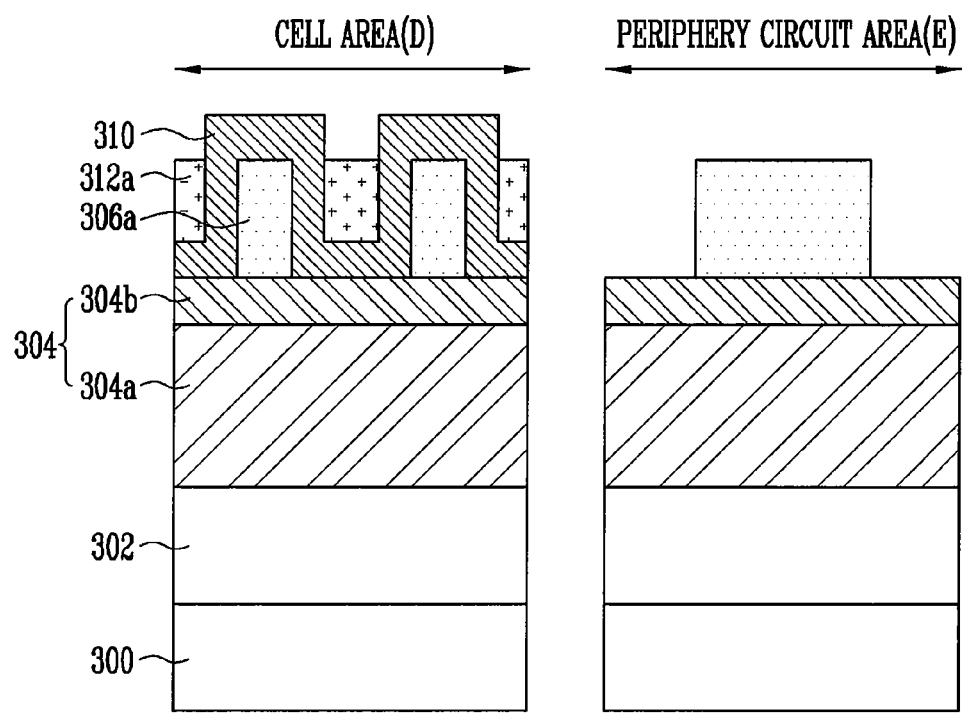

Referring to FIG. 3G and FIG. 4G, after the second photoresist patterns 314 are removed, the second auxiliary layer formed on the cell area D is etched using an etchback process until an upper portion of the insulating layer 310 is exposed to form the second auxiliary patterns 312a. During the process for etching the second auxiliary layer formed on the cell area D, the second auxiliary pattern 312a formed between the insulating layers 310 is leveled with the first auxiliary pattern 306a. During the process for etching the second auxiliary layer formed on the cell area D, the insulating layer 310 formed on the periphery circuit area E is also removed until an upper portion of the first auxiliary pattern 306a is exposed.

Consequently, the second auxiliary layer remains only on an area on which the recess "f" (described with reference to FIG. 3C and FIG. 4C) is generated. As a result, the second auxiliary pattern 312a is formed in a shape which is the same as that of the first auxiliary pattern 306a. That is, the second auxiliary pattern 312a having a shape which is the same as that of the first auxiliary pattern 306 is formed on a central portion of a tetragonal space among four adjacent first auxiliary patterns 306a.

Figure 3H:
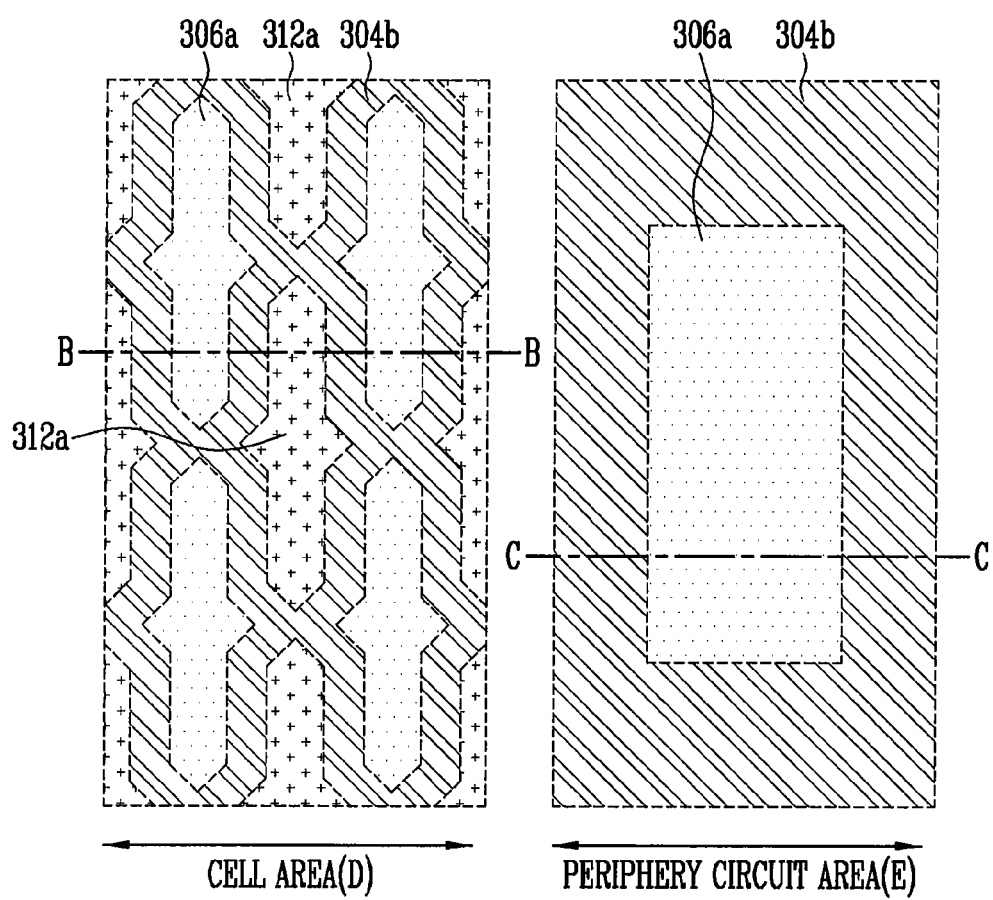
Figure 4H:
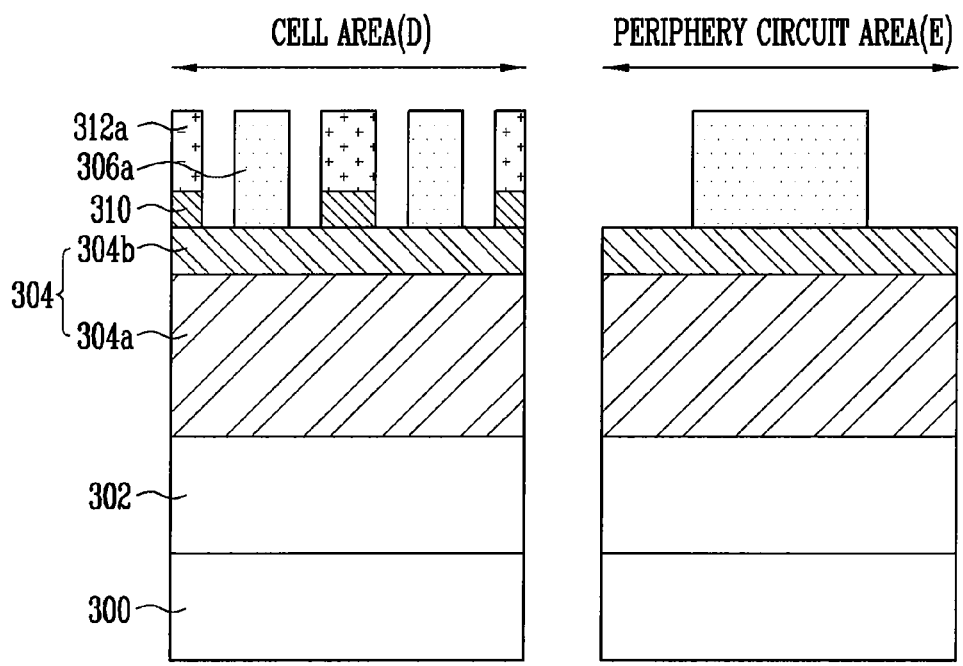

Referring to FIG. 3H and FIG. 4H, after forming the second auxiliary pattern 312a on the cell area D, the exposed insulating layer 310 and the layer 310 formed between the first auxiliary pattern 306a and the second auxiliary pattern 312a are removed such that the insulating layer 300 remains below only the second auxiliary pattern 312a. The insulating layer 310 is removed through a dry etching process in which $O_2$ plasma is utilized. During the process for etching the insulating layer 310, the insulating layer 310 has an etching selection ratio which differs from those of the first auxiliary patterns 306a and the second auxiliary pattern 312a. Accordingly, the first auxiliary patterns 306a and the second auxiliary pattern 312a are not etched. As described above, by forming the second auxiliary patterns 312a having a shape which is the same as that of the first auxiliary pattern 306a between the first auxiliary patterns 306a, the patterns having the predetermined pitch are formed.

Figure 4I:
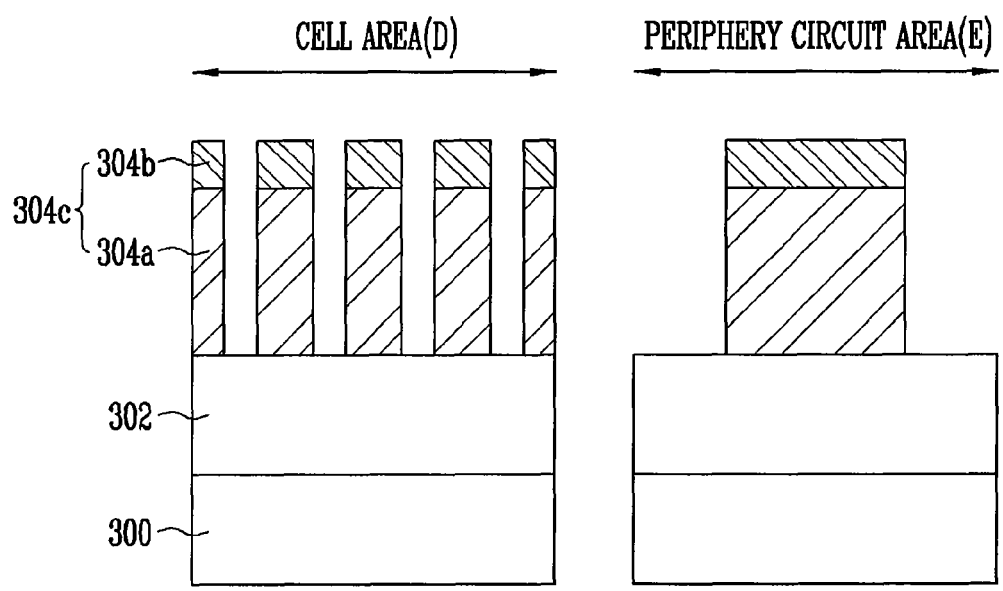

Referring to FIG. 3I and FIG. 4I, the hard mask layer 304 is etched using the first auxiliary pattern 306a and the second auxiliary pattern 312a as an etching mask to form the hard mask patterns 304c having a desired line and space. The hard mask layer 304 is removed through a dry etching process.

Subsequently, the first auxiliary pattern 306a, the insulating layer 310 and the second auxiliary pattern 312a are removed.

Figure 4J:
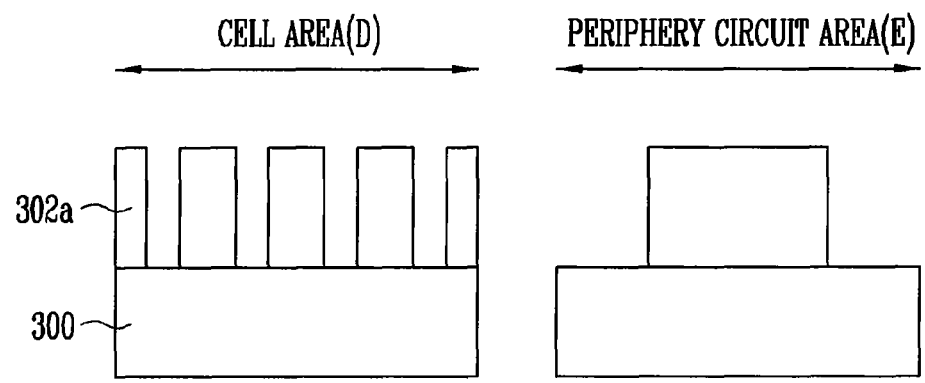

Referring to FIG. 3J and FIG. 4J, the etching object layer 302 is etched using the hard mask patterns 304c having the desired line and space as an etching mask to form desired target patterns 302a. The hard mask patterns 304c are then removed.

Although not shown in the drawings, it is possible to etch a part of the semiconductor substrate 300 using the target patterns 202a as an etching mask to form a trench for an isolation layer.

As described above, by forming the second auxiliary pattern 312a having a shape which is the same as that of the first auxiliary pattern 306a between the first auxiliary patterns 306a, the micro pattern having a desired critical dimension (CD) can be formed and the above method is applicable to a process for forming an isolation layer. In addition, since the above method can form a pattern which is finer than a resolution of conventional exposure equipment and is applicable to a process for forming the isolation layer, a resolution limit of exposure equipment can be overcome. Further, without developing exposure equipment having excellent resolution characteristics, the micro pattern can be formed by conventional exposure equipment.

The present invention as described above has the effects as follows.

First, the micro pattern is formed by forming the cross-shaped first auxiliary pattern comprising a linear vertical portion and a horizontal portion protruding from both sides of a central portion of the vertical portion and the second auxiliary pattern having a shape which is the same as that of the first auxiliary pattern and formed between the first auxiliary patterns. End portions of the vertical and horizontal portions have a pointed-shape. Due to the above structure, a micro pattern having a desired critical dimension (CD) can be formed and the above method is applicable to a process for forming an isolation layer.

Second, since the above method can form the pattern which is finer than a resolution of conventional exposure equipment and is applicable to a process for forming the isolation layer, a resolution limit of exposure equipment can be overcome.

Third, without developing exposure equipment having excellent resolution characteristics, the micro pattern can be formed using conventional exposure equipment.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of forming a micro pattern in a semiconductor device, the method comprising:
    forming an etching object layer and a hard mask layer on a semiconductor substrate;
    forming cross-shaped first auxiliary patterns on the hard mask layer;
    forming an insulating layer on the hard mask layer including the first auxiliary pattern;
    forming a second auxiliary pattern on the insulating layer between the first auxiliary patterns;
    performing an etching process such that the insulating layer remains only on a lower portion of the second auxiliary pattern;
    etching the hard mask using the first and second auxiliary patterns as an etching mask to form a hard mask pattern; and
    etching the etching object layer using the hard mask pattern as an etching mask.

2. The method of forming a micro pattern in a semiconductor device according to claim 1, wherein the first auxiliary patterns are arranged in a matrix shape on the hard mask.

3. The method of forming a micro pattern in a semiconductor device according to claim 1, wherein each first auxiliary pattern comprises a linear vertical portion and a horizontal portion protruding from both sides of a central portion of the vertical portion, the horizontal portion and the vertical portion having different lengths.

4. The method of forming a micro pattern in a semiconductor device according to claim 1, wherein each first auxiliary pattern is formed such that end portions thereof have a pointed-shape.

5. The method of forming a micro pattern in a semiconductor device according to claim 1, wherein the insulating layer has a thickness such that the insulating layer formed on a side wall of an end portion of the first auxiliary pattern comes in contact with the insulating layer formed on a side wall of an end portion of an adjacent first auxiliary pattern.

6. The method of forming a micro pattern in a semiconductor device according to claim 1, wherein the second auxiliary pattern has a shape that is the same as that of the first auxiliary pattern.

7. The method of forming a micro pattern in a semiconductor device according to claim 1, wherein the second auxiliary pattern is formed on a central portion of a tetragonal space among four adjacent first auxiliary patterns.

8. A method of forming a micro pattern in a semiconductor device, the method comprising:
    forming an etching object layer and a hard mask layer on a semiconductor substrate;
    forming first auxiliary patterns, wherein each first auxiliary pattern comprises a linear vertical portion and a horizontal portion protruding from both sides of a central portion of the vertical portion, the horizontal portion having a length which differs from that of the vertical portion;
    forming an insulating layer and a second auxiliary layer on the hard mask layer and the first auxiliary pattern;
    performing a first etching process such that the second auxiliary layer remains on the insulating layer between the first auxiliary patterns so that the remaining second auxiliary layer becomes a second auxiliary pattern having a shape that is the same as that of the first auxiliary pattern;
    removing the insulating layer on the first auxiliary pattern and between the first and second auxiliary patterns;
    etching the hard mask layer through a second etching process using the first and second auxiliary patterns as an etching mask to form a hard mask pattern; and
    etching the etching object layer through a third etching process using the hard mask pattern as an etching mask.

9. The method of forming a micro pattern in a semiconductor device according to claim 8, wherein the etching object layer comprises an insulating layer or a conductive layer.

10. The method of forming a micro pattern in a semiconductor device according to claim 8, wherein the hard mask layer has a stack structure comprising an amorphous carbon layer and a silicon oxide nitride (SiON) layer.

11. The method of forming a micro pattern in a semiconductor device according to claim 8, wherein the first auxiliary layer comprises a polysilicon layer or an oxide layer.

12. The method of forming a micro pattern in a semiconductor device according to claim 8, wherein the first auxiliary pattern has a critical dimension (CD) which is approximately half of a pitch of micro patterns formed through a final process.

13. The method of forming a micro pattern in a semiconductor device according to claim 8, wherein the first auxiliary patterns are arranged in a matrix shape on the hard mask layer.

14. The method of forming a micro pattern in a semiconductor device according to claim 8, wherein each first auxiliary pattern is formed such that end portions thereof have a pointed-shape.

15. The method of forming a micro pattern in a semiconductor device according to claim 8, wherein the insulating layer comprises a carbon layer.

16. The method of forming a micro pattern in a semiconductor device according to claim 8, wherein the insulating layer comprises material having an etching selection ratio which differs from that of material of the second auxiliary layer and the first auxiliary pattern.

17. The method of forming a micro pattern in a semiconductor device according to claim 8, wherein the insulating layer has a thickness which is an approximately half of a pitch of micro patterns formed by a final process.

18. The method of forming a micro pattern in a semiconductor device according to claim 8, wherein the insulating layer has a thickness such that the insulating layer formed on a side wall of an end portion of the first auxiliary pattern comes in contact with the insulating layer formed on a side wall of an end portion of the adjacent first auxiliary pattern.

19. The method of forming a micro pattern in a semiconductor device according to claim 8, wherein the second auxiliary layer comprises conductive material or insulative material.

20. The method of forming a micro pattern in a semiconductor device according to claim 8, wherein the second auxiliary layer comprises a bottom anti-reflective coating (BARC) containing spin on glass (SOG) material or silicon (Si).

21. The method of forming a micro pattern in a semiconductor device according to claim 20, further comprising performing a baking process after a deposition process if the second auxiliary layer is formed from spin on glass (SOG) material.

22. The method of forming a micro pattern in a semiconductor device according to claim 21, wherein the bake process is performed at a temperature of 150° C. to 400° C.

23. The method of forming a micro pattern in a semiconductor device according to claim 8, wherein the second auxiliary layer is etched by an etchback process.

24. The method of forming a micro pattern in a semiconductor device according to claim 8, wherein the second auxiliary pattern is leveled with the first auxiliary pattern during the first etching process.

25. The method of forming a micro pattern in a semiconductor device according to claim 8, wherein the insulating layer is removed through a dry etching process in which $O_2$ plasma is utilized.

26. The method of forming a micro pattern in a semiconductor device according to claim 8, wherein the insulating layer has an etching selection ratio which differs from those of the first auxiliary pattern and the second auxiliary layer during the first etching process and the process for removing the insulating layer.

27. The method of forming a micro pattern in a semiconductor device according to claim 8, wherein the second auxiliary pattern is formed on a central portion of a tetragonal space among four adjacent first auxiliary patterns.

28. The method of forming a micro pattern in a semiconductor device according to claim 8, wherein the second etching process is a dry etching process.

29. The method of forming a micro pattern in a semiconductor device according to claim 8, wherein the etching object layer and a portion of the semiconductor substrate are etched to form a trench for an isolation layer during the third etching process.

30. The method of forming a micro pattern in a semiconductor device according to claim 8, further comprising etching a portion of the semiconductor substrate during the third etching process to form a trench for an isolation layer along with the etched etching object layer.

31. A method of forming a micro pattern in a semiconductor device, the method comprising:
    forming an etching object layer and a hard mask layer on a semiconductor substrate on which a cell area and a periphery circuit area are defined;
    forming first auxiliary patterns on the hard mask layer, wherein each first auxiliary pattern comprises a linear vertical portion and a horizontal portion protruding from both sides of a central portion of the vertical portion, the horizontal portion having a length which differs from that of the vertical portion;
    forming an insulating layer and a second auxiliary layer on the hard mask layer and the first auxiliary pattern;
    removing the second auxiliary layer formed on the periphery circuit area;
    performing a first etching process such that the second auxiliary layer formed on the cell area remains on the insulating layer between the first auxiliary patterns so that the remaining second auxiliary layer becomes a second auxiliary pattern having a shape that is the same as that of the first auxiliary pattern;
    removing the insulating layer on the first auxiliary pattern and the insulating layer between the first and second auxiliary patterns in the cell area;
    etching the hard mask layer through a second etching process using the first and second auxiliary patterns as an etching mask to form a hard mask pattern; and
    etching the etching object layer through a third etching process using the hard mask pattern as an etching mask.

32. The method of forming a micro pattern in a semiconductor device according to claim 31, wherein the etching object layer comprises an insulating layer or a conductive layer.

33. The method of forming a micro pattern in a semiconductor device according to claim 31, wherein the first auxiliary layer comprises a polysilicon layer or an oxide layer.

34. The method of forming a micro pattern in a semiconductor device according to claim 31, wherein the first auxiliary pattern has a critical dimension (CD) which is approximately half of a pitch of micro patterns formed through a final process.

35. The method of forming a micro pattern in a semiconductor device according to claim 31, wherein the first auxiliary patterns are arranged in a matrix shape on the hard mask layer.

36. The method of forming a micro pattern in a semiconductor device according to claim 31, wherein each first auxiliary pattern is formed such that end portions thereof have a pointed-shape.

37. The method of forming a micro pattern in a semiconductor device according to claim 31, wherein the insulating layer comprises a carbon layer.

38. The method of forming a micro pattern in a semiconductor device according to claim 31, wherein the insulating layer comprises material having an etching selection ratio which differs from that of material of the second auxiliary layer and the first auxiliary pattern.

39. The method of forming a micro pattern in a semiconductor device according to claim 31, wherein the insulating layer has a thickness which is approximately half of a pitch of micro patterns formed by a final process.

40. The method of forming a micro pattern in a semiconductor device according to claim 31, wherein the insulating layer has a thickness such that the insulating layer formed on a side wall of an end portion of the first auxiliary pattern comes in contact with the insulating layer formed on a side wall of an end portion of the adjacent first auxiliary pattern.

41. The method of forming a micro pattern in a semiconductor device according to claim 31, wherein the second auxiliary layer comprises conductive material or insulative material.

42. The method of forming a micro pattern in a semiconductor device according to claim 31, wherein the second auxiliary layer comprises a bottom anti-reflective coating (BARC) containing spin on glass (SOG) material or silicon (Si).

43. The method of forming a micro pattern in a semiconductor device according to claim 42, further comprising performing a baking process after a deposition process if the second auxiliary layer is formed from spin on glass (SOG) material.

44. The method of forming a micro pattern in a semiconductor device according to claim 43, wherein the bake process is performed at a temperature of 150° C. to 400° C.

45. The method of forming a micro pattern in a semiconductor device according to claim 31, wherein the second auxiliary layer formed on the periphery circuit area is removed through a dry etching process using the insulating layer as an etching mask.

46. The method of forming a micro pattern in a semiconductor device according to claim 31, wherein the insulating layer formed on the periphery circuit area is removed during the process for etching the second auxiliary layer formed on the cell area.

47. The method of forming a micro pattern in a semiconductor device according to claim 31, wherein the second auxiliary pattern is leveled with the first auxiliary pattern during the first etching process.

48. The method of forming a micro pattern in a semiconductor device according to claim 31, wherein the insulating layer has an etching selection ratio which differs from those of the first auxiliary pattern and the second auxiliary layer during the first etching process and the process for removing the insulating layer.

49. The method of forming a micro pattern in a semiconductor device according to claim 31, wherein the second auxiliary pattern is formed on a central portion of a tetragonal space among four adjacent first auxiliary patterns.

50. The method of forming a micro pattern in a semiconductor device according to claim 31, wherein the second etching process is a dry etching process.

51. The method of forming a micro pattern in a semiconductor device according to claim 31, wherein the etching object layer and a portion of the semiconductor substrate are etched to form a trench for an isolation layer during the third etching process.

52. The method of forming a micro pattern in a semiconductor device according to claim 31, further comprising etching a portion of the semiconductor substrate during the third etching process to form a trench for an isolation layer along with the etched etching object layer.

53. The method of forming a micro pattern in a semiconductor device according to claim 31, wherein the hard mask layer has a stack structure comprising an amorphous carbon layer and a silicon oxide nitride (SiON) layer.

* * * * *